United States Patent
Tashiro et al.

(10) Patent No.: US 7,129,726 B2
(45) Date of Patent: Oct. 31, 2006

(54) TESTING DEVICE AND TESTING METHOD OF A SEMICONDUCTOR DEVICE

(75) Inventors: Kazuhiro Tashiro, Kawasaki (JP); Yasuyuki Itou, Kawasaki (JP); Shigeyuki Maruyama, Kawasaki (JP); Yoshikazu Arisaka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/211,094

(22) Filed: Aug. 25, 2005

(65) Prior Publication Data

US 2006/0220667 A1 Oct. 5, 2006

(30) Foreign Application Priority Data

Mar. 31, 2005 (JP) ............................... 2005-105226

(51) Int. Cl.
*G01R 31/02* (2006.01)

(52) U.S. Cl. ..................... 324/754; 324/757; 324/765

(58) Field of Classification Search ..................... None
See application file for complete search history.

(56) References Cited

U.S. PATENT DOCUMENTS 5,192,908 A * 3/1993 Shibata ..................... 324/761
5,489,853 A * 2/1996 Nakajima .................. 324/754
6,111,421 A * 8/2000 Takahashi et al. .......... 324/758
6,433,563 B1 * 8/2002 Maruyama ................ 324/754
6,838,868 B1 * 1/2005 Bosy ...................... 324/158.1

FOREIGN PATENT DOCUMENTS

| JP | 63-114233 | 5/1988 |
|----|-----------|--------|
| JP | 1-147382 | 6/1989 |
| JP | 2003-66109 | 3/2003 |

* cited by examiner

*Primary Examiner*—Vinh Nguyen
*Assistant Examiner*—Richard Isla-Rodas
(74) *Attorney, Agent, or Firm*—Westerman, Hattori, Daniels & Adrian, LLP.

(57) ABSTRACT

A testing device can perform a test on an arbitrary one of a plurality of semiconductor devices by pressing the semiconductor devices onto a contactor from a back side of the semiconductor device. A test circuit board has a contactor provided with contact pieces corresponding to external connection terminals of semiconductor devices to be tested. A support board is capable of mounting the semiconductor devices thereon in an aligned state. A stage supports the support board. A press head presses the semiconductor devices to be tested mounted on the support board so as to cause external connection terminals of the semiconductor devices to be tested to contact with the contact pieces of the contactor. The stage is movable to a position at which at least one of the semiconductor devices to be tested, which are mounted on the support board, faces the contactor.

15 Claims, 20 Drawing Sheets

VIBRATION OF MICRO AMPLITUDE

VIBRATION OF MICRO AMPLITUDE

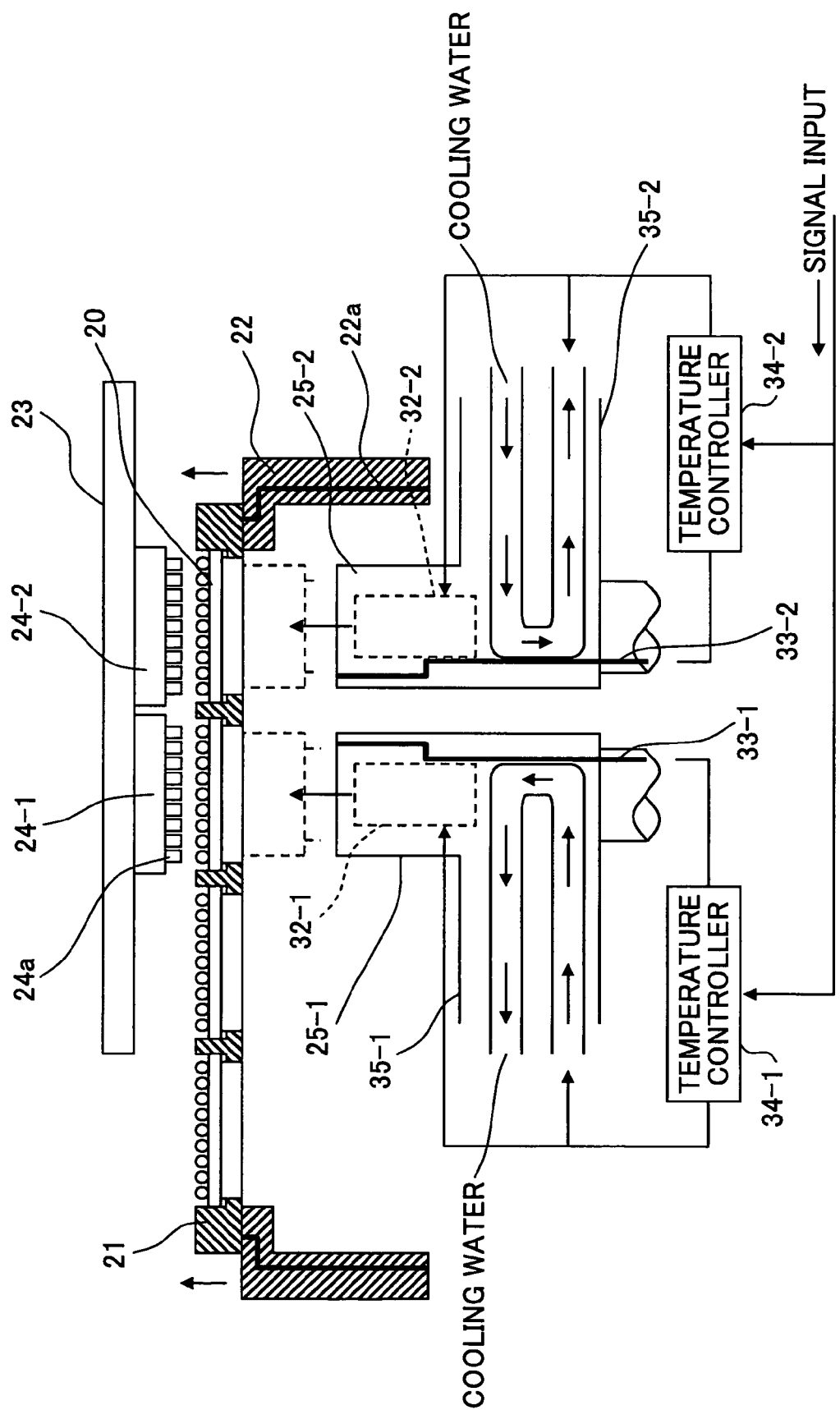

TESTING DEVICE AND TESTING METHOD OF A SEMICONDUCTOR DEVICE

BACKGROUND OF THE INVENTION

1. Field of the Invention

The present invention relates to testing devices and methods of a semiconductor device and, more particularly to a testing device and method for performing a characteristic test of a semiconductor device while taking an electric conduction to the semiconductor device.

2. Description of the Related Art

In recent years, with increase in electric current and power consumption of a semiconductor integrated circuit device (hereinafter, referred to as a semiconductor device) such as an MPU (Micro Processing Unit) for high-end users or a CPU (Central Processing Unit) for personal computers. In an SiP (System in Package) which constitutes a system by accommodating a plurality of semiconductor devices in a single outer package (accommodation container), there is a PoP (Package on Package) which constitutes a single outer package by mounting other semiconductor devices on a back surface of one semiconductor device.

In a semiconductor device having the PoP structure, external connection terminals for electrical connection to external part are provided even in a second semiconductor device mounted on a back surface of a first semiconductor device so as to perform a characteristic test on the second semiconductor device using the external connection terminals together with a characteristic test using external connection terminals on the first semiconductor device.

Additionally, in recent years, there is a demand for further miniaturization of semiconductor devices in order to materialize portable electronic equipments such a portable phone, a digital still camera, a digital video camera, a notebook-type personal computer, a PDA (Personal Digital Assistant) or the like.

For this reason, even in a CSP (chip size package) such as an FBGA (Fine-pitch Ball Grid Array), an FLGA (Fine-pitch Land Grid Array) or a QFN (Quad Flat Non-lead Package), a further miniaturization and reduction in a pitch are progressed.

Since a form of the outer packages of semiconductor devices has been diversifying as mentioned above, there is a need for preparing many kinds of tools in a manufacturing process and a characteristic test process of semiconductor devices.

There is provided a method of performing a measuring test at a predetermined position while sequentially conveying a tray by positioning aligned flat packages to a probe board by a stage mechanism (For example, refer to Patent Document 1).

In this method, an IC test handler is used. The IC test handler comprises: an IC tray having an IC accommodating opening provided with a positioning mechanism; a stage mechanism for performing a motion control of the IC tray with high accuracy; a probe board attached at a predetermined position within a motion control range of the IC accommodating opening by the stage mechanism; and an IC push socket that lifts an IC from underneath the accommodating opening of the tray to cause pins to contact with probe needles.

Moreover, there is suggested a method of performing a measurement test at a predetermined position by temporarily mounting packages on a board (an arranging board such as a tray) onto which flat packages are mountable and sequentially conveying in the same manner as the above-mentioned Patent Document 1 (refer to Patent Document 2).

The board used in this method mainly aims to cause the same board to be used for packages of the same kind of outer configuration. In this method, a test handler of a semiconductor device is used. The test handler comprises: a press up device having a support part for supporting an IC that moves upward and downward; an IC tester provided above the press up device and having contact pieces contactable with IC leads; a board movably provided between the IC tester and the above-mentioned press up device and having an insertion opening into which the above-mentioned support part is insertable and a receiving table that supports an IC package in the insertion opening, a size of a width is the same for the same kinds of IC and also different kinds of IC; a support guide provided with a predetermined width corresponding to the size of the board; and means for conveying the board along the support guide.

In a conventional characteristic test of semiconductor devices, a method like the following A or B is taken as a processing method of electrically connecting a semiconductor device to a characteristic testing board.

A) A method of conveying a semiconductor device to be tested to a position of a contactor mounted on the characteristic testing board in a state where external connection terminals thereof face a lower surface, attaching the semiconductor device in a state where it is positioned to a contactor, and pressing it by a press head.

B) A method of accommodating a semiconductor device in an arranging plate in a state where external connection terminals thereof face upward or arranging the semiconductor device on a stage in a state where it is applied onto a tacking tape, positioning the stage to a contactor by moving the stage in X and Y directions, and thereafter pressing it onto the contactor by lifting the stage.

Here, in the test method of A), it is difficult to perform a temperature control by cooling or heating the press head since the conveyance/press head moves in a wide range. Additionally, it is very difficult to perform a characteristic test on back terminals of a semiconductor device such as the PoP. Further, since there are various kinds of outer package forms of a semiconductor device, it is needed to prepare a contactor having a positioning function corresponding to each individual kind of semiconductor device. Additionally, in the method of B), it is difficult to perform a temperature control and a characteristic test on the back terminals, like the above-mentioned method A), since the back surface of the semiconductor device is covered due to the semiconductor device being fixed to the stage in a state where the semiconductor device is reversed and accommodated in an arranging plate with the external connection terminals facing upward or in a state where it is applied onto a tacking tape.

Especially, with respect to the temperature control, since a temperature characteristic differs from semiconductor devices, a method (refer to Patent Document 3) of detecting a temperature of a part of the stage and performing a temperature control by cooling or heating a whole surface of the stage by feeding back a result of the temperature detection cannot control the semiconductor device at a desired temperature.

A description will be given, with reference to the drawings, of the above-mentioned methods A) and B). FIG. 1 shows a process of a characteristic test according to the above-mentioned method A).

In the method, first, semiconductor devices 2 accommodated in a conveyance tray in an aligned manner are taken out by a suction head 3 (FIG. 1-(A)). Then, the semiconductor devices 2 are conveyed to and placed on a positioning stage 4 (FIG. 1(B)). Then, the semiconductor devices 2 are held by a press head/suction device 5, and are conveyed to a contactor 7 mounted on a test circuit board 6. The semiconductor devices 2 are pressed onto the contactor 7 by the press head/suction device 5 so as to make an electrical contact to perform a characteristic test (FIG. 1-(C)).

Thereafter, the semiconductor devices 2 are taken out of the contactor 7 by the press/suction head 5 and the semiconductor devices are placed on a positioning stage 4. After that, the semiconductor devices 2 are taken out of the positioning stage 4 (FIG. 1-(D)), and are accommodated in a conveyance tray 8 (FIG. 1-(E)).

A description will now be given, with reference to FIG. 2, of a characteristic test according to the above-mentioned method B).

In the test processing method, semiconductor devices 12 accommodated in a conveyance tray 11 serving as an alignment plate with external connection terminals facing upward are fixed on a stage 13 movable in a horizontal direction by suctioning through a suction hole 13a. Then, the semiconductor devices 12 are pressed onto a contactor 15 of a test circuit board 14 located above the semiconductor devices 12 so as to make an electrical connection to perform a test measurement.

It should be noted that instead of the method in which the semiconductor devices 12 are accommodated in the conveyance tray 11 serving as an alignment plate, another method may be used, in which the semiconductor devices 12 are applied onto a UV tape 16 which is applied with a UV curable adhesive 16a on one side thereof and the semiconductor devices 12 are pealed off after curing the UV curable adhesive 16a by UV irradiation. According to this method, the semiconductor devices 12 are conveyed by applying them onto the UV tape 16 and fixing a periphery of the UV tape 16 to a fixing frame 17.

Patent Document 1: Japanese Laid-Open Patent Application No. 1-147382

Patent Document 2: Japanese Laid-Open Patent Application No. 63-114233

Patent Document 3: Japanese Laid-Open Patent Application No. 2003-66109

There are the following problems in the methods disclosed in the above-mentioned Patent Documents 1 and 2.

1) A measurement test by selecting an arbitrary semiconductor device cannot be performed since the tray accommodating the semiconductor devices in an aligned manner is sequentially moved.

2) For the reason mentioned above, a measurement test by simultaneously selecting a plurality of arbitrary semiconductor devices cannot be performed.

3) A temperature control on a top side of a chip mounted inside cannot be performed since the semiconductor device is heated or cooled for the purpose of performing a test of a flat package, which provides a temperature control from a bottom surface of the package.

4) A temperature control of a plurality of semiconductor devices cannot be performed since a measurement test by selecting a plurality of arbitrary semiconductor devices cannot be performed.

On the other hand, in the characteristic test shown in FIG. 1, it is difficult to perform a temperature control such as cooling or heating the semiconductor devices 2 being tested since the press/suction head 5 moves in a wide range. For example, it is difficult to provide to the press/suction head 5 a liquid cooling unit, heat releasing fins and a blower for air cooling or a heater for heating and a temperature sensor.

Additionally, in the characteristic test using the press/suction head 5 moving in a wide range, it is very difficult to perform a characteristic test by making an electrical contact to terminals of a semiconductor device such as the above-mentioned PoP that has external connection terminals on a back surface thereof. For example, it is difficult to provide to the above-mentioned press/suction head 5 contact pieces as a contactor and pats and wiring for electric connection.

Further, when positioning to the contactor 7 by a press/suction head 5, the positioning to a normal position is achieved by being guided by a positioning guide provided to the contactor due to the weight of the semiconductor device itself when the semiconductor device is put inside the contactor 7. In such a case, a positioning member must be prepared in accordance with the outer package configuration of the semiconductor device. In the above-mentioned contactor 7, it is necessary to prepare an exclusive contactor for each different outer dimension or terminal arrangement of the outer package of the semiconductor device.

On the other hand, in the characteristic test method shown in FIG. 2, it is difficult to perform a temperature control such as cooling or heating since the back surface of the semiconductor device 12 is covered by the stage 13. In the above-mentioned conveyance tray 11, conventionally, a liquid cooling unit for cooling and a heater for heating and also a temperature sensor and wiring are provided in the stage 13, which is movable in a horizontal direction. However, it is necessary to transfer a heat to the semiconductor device 12 through the conveyance tray 11, which is placed and fixed to a top surface of the stage 13. That is, a path for transferring heat is an indirect heat conducting path. Thus, a heat resistance of the heat conducting path is large, and it is difficult to perform a temperature control.

Further, in the characteristic test method shown in FIG. 2, it is controlled to fall in a desired temperature range by attaching a temperature sensor at a specific position on the stage 13, where the conveyance tray 11 is placed, so as to perform an operation or stop of a cooling unit and a heater by feeding back a result of detection of the temperature sensor to a temperature controller. Accordingly, when performing a characteristic test of semiconductor devices having different temperature characteristics, a temperature control of specific positions may be performed, but it is difficult to perform a characteristic test while controlling the temperatures of all the semiconductor devices to fall within a desired temperature range.

Moreover, in the characteristic test method shown in FIG. 2, the semiconductor devices 12, which are aligned and accommodated within one section of the conveyance tray 11, are accommodated with a play in a certain range within the one section so as to facilitate accommodation of the semiconductor devices. Thus, it is difficult to perform accurate positioning between the semiconductor devices 12 and the contactor 15. Additionally, it is very difficult to perform a characteristic test by making an electrical contact with external connection terminals of a semiconductor device such as the PoP, which has the external connection terminals on the back surface thereof since the back surface of the semiconductor device 12 is covered by the conveyance tray 11.

Moreover, in the case where the UV tape 16 is used as shown in FIG. 3, since the back surface of the semiconductor device 12 is covered by the UV tape 16 similarly to the case of the above-mentioned conveyance tray 11, it is difficult to perform a temperature control by cooling and heating.

Additionally, it is difficult to make an electrical contact to the terminals on the back surface of the semiconductor device 12 from the back side.

SUMMARY OF THE INVENTION

It is a general object of the present invention to provide an improved and useful testing device and method of a semiconductor device, in which the above-mentioned problems are eliminate.

A more specific object of the present invention is to provide a testing device and method of a semiconductor device that can perform a test on an arbitrary one of a plurality of semiconductor devices by pressing the semiconductor device onto a contactor from a back side of the semiconductor device.

In order to achieve the above-mentioned objects, there is provided according to one aspect of the present invention a testing device of a semiconductor device, comprising: a test circuit board having a contactor provided with contact pieces corresponding to external connection terminals of semiconductor devices to be tested; a support board that is capable of mounting the semiconductor devices thereon in an aligned state; a stage supporting the support board; and a press head that presses the semiconductor devices to be tested mounted on the support board so as to cause external connection terminals of the semiconductor devices to be tested to contact with the contact pieces of the contactor, wherein the stage is movable to a position at which at least one of the semiconductor devices to be tested, which are mounted on the support board, faces the contactor.

Additionally, there is provided according to another aspect of the present invention a testing method of a semiconductor device, comprising: a step of mounting a plurality of semiconductor devices on a support board in an aligned state, each of the semiconductor devices having external connection terminals on one of main surfaces, the external connection terminals being exposed from the support board; a step of causing the support board to face a contactor of a testing device; a step of pressing a first one of the semiconductor devices from the other of the main surfaces so as to contact the external connection terminals of the first one of the semiconductor devices with contact pieces of the contactor; a step of performing a test on the first one of the semiconductor devices through the contactor; a step of accommodating the first one of the semiconductor devices in the support board; a step of moving the support board; a step of pressing a second one of the semiconductor devices from the other of the main surfaces so as to contact the external connection terminals of the second one of the semiconductor devices with the contact pieces of the contactor; and a step of performing a test on the second one of the semiconductor devices through the contactor.

According to the present invention, the semiconductor device is mounted on the support board with the back surface, which is opposite to the electrodes of the semiconductor device, facing downward, and is pressed onto the contactor in a state where the back surface is supported by the press head. The semiconductor device pressed by the contactor is selected by placing one of the semiconductor devices held by the support board by horizontally moving the stage. Accordingly, only a vertically moving mechanism is provided to the press head, which can make the press head in a simple structure. Thus, the heater or the cooling unit for temperature control can be provided to the press head so as to support the back surface of the semiconductor device, which is close to a heat radiator plate, by the press head, thereby performing a temperature control of the semiconductor device efficiently.

Other objects, features and advantages of the present invention will become more apparent from the following detailed descriptions when read in conjunction with the accompanying drawings.

BRIEF DESCRIPTION OF THE DRAWINGS

FIG. 32 is an illustration showing a testing device that performs a temperature control individually while performing a test simultaneously on a plurality of semiconductor devices.

DETAILED DESCRIPTION OF THE PREFERRED EMBODIMENTS

A description will now be given, with reference to FIGS. 4 through 6, of a testing device and method according to a first embodiment of the present invention. It should be noted that FIG. 7 shows a part of the testing device according to the first embodiment of the present invention.

Figure 7:
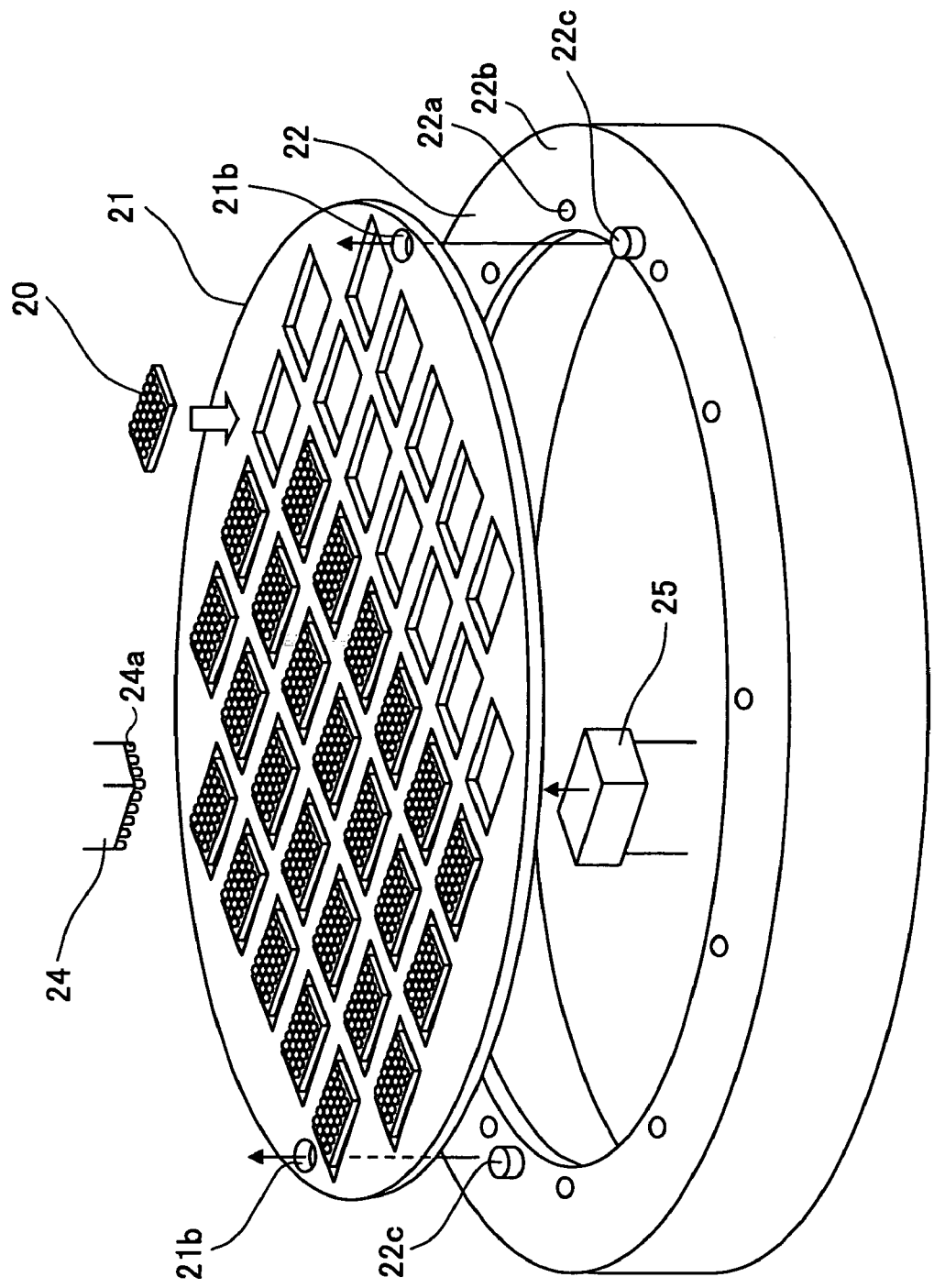
FIG. 7 is a perspective view of a part of a testing device used in the testing method according to the first embodiment of the present invention.
Figure 8:
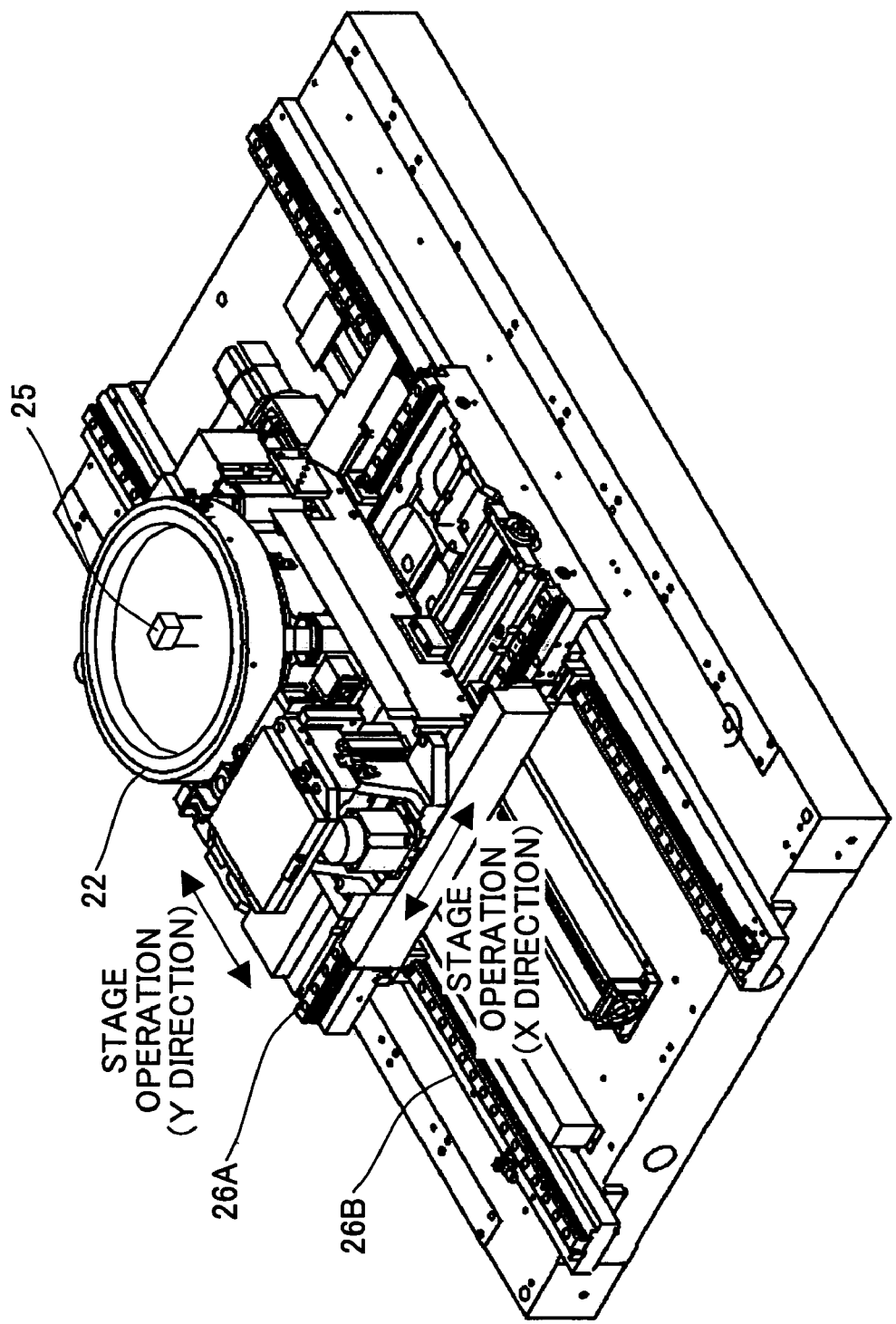
FIG. 8 is a perspective view of an XY stage having an XY moving mechanism.

The testing method according to the first embodiment of the present invention is performed by using a testing device that comprises, as shown in FIG. 7, a support board 21 on which a plurality of semiconductor devices 20 to be tested in an aligned state and a stage 22 that is formed in an annular shape to support a peripheral portion of the support board 21.

The support board 21 is made of a metal material such as aluminum or stainless steel or a resin material such as plastics. The support board 21 is provided with recessed portions 21a for accommodating the semiconductor devices 20 in an aligned state in an X direction and a Y direction. Each of the recessed portions 21a has a configuration substantially the same as the outer configuration of each of the semiconductor devices 20 and extends through the support board 21 so as to accommodate one of the semiconductor devices 20. Each of the recessed portions 21a has a step portion on an inner surface thereof so that each of the semiconductor devices 20 is held inside the corresponding recessed portion 21a and prevented from being fallen therefrom (for example, refer to FIG. 4). Additionally, the support board 21 is provided with positioning holes 21b.

The semiconductor devices 20 to be tested are accommodated in the recessed portions 21a, respectively, in a state where external connection terminals 20a such as ball electrodes provided on one of main surfaces of the semiconductor device 20 are exposed on a front side. Accordingly, the other main surface of each of the semiconductor devices 20 is exposed from the recessed portion 21a on a back side of the support board 21.

The stage 22 has a cylindrical shape, and is provided with suction holes 22b and positioning pins 22c on a top surface 22a on which the above-mentioned support board 21 is mounted.

When placing the support board 21 on the top surface 22b of the stage 22, positioning of the support board 21 is performed by fitting the positioning holes 21b provided on the support board 21 to the positioning pins 22c, respectively. The support board 21 is fixed to the stage 22 by suctioning through the suction holes 22a.

The suction holes 22a are connected to a suctioning device such as a vacuum pump (not shown in the figure).

A test circuit board 23 is provided above the stage 22, that is, on the side facing the external connection terminals 20a of the semiconductor devices 20 to be tested.

A contactor 24 is provided on a lower surface of the test circuit board 23. The contactor 24 has contact pieces 24a for electrically connecting the semiconductor devices 20 to the test circuit board 23 by making a contact with the external connection terminals 20a of the semiconductor devices 20 to be tested.

On the other hand, a press head 25, which is movably supported by an upward and downward moving mechanism (not shown in the figure), is provided in an inner space of the stage 22. The press head 25 has a press surface 25a which supports and presses the other main surface 20b of each of the semiconductor devices 20 supported by the support board 21.

The test circuit board 23 and the press head 25 maintain predetermined positions without moving in a horizontal (transverse) direction. The press head 25 is located directly under the contactor 24 in response to the contactor 24 so as to be movable upward and downward with respect to the contactor 24.

Here, the semiconductor devices 20 held by the support board (alignment plate) 21 are located between the press head 25 and contactor 24 in a state where the support board 21 is placed on and fixed to the stage 22.

The stage 22 is an XY stage having an XY moving mechanism 26 including a linear guide 26A for the X direction and a linear guide 26B for the Y direction. Thus, the stage 22 is movable in the X and Y directions (horizontal directions).

Thus, any one of the plurality of semiconductor devices 20 held by the support board 21 can be moved to a position directly under the contactor 24 of the test circuit board 23 by moving the stage 22 in the horizontal (transverse) directions. That is, the stage 22 can be moved horizontally so that the electrodes 20a of the selected semiconductor device 20 are positioned directly under the contact pieces 24a of the contactor 24.

Figure 1:
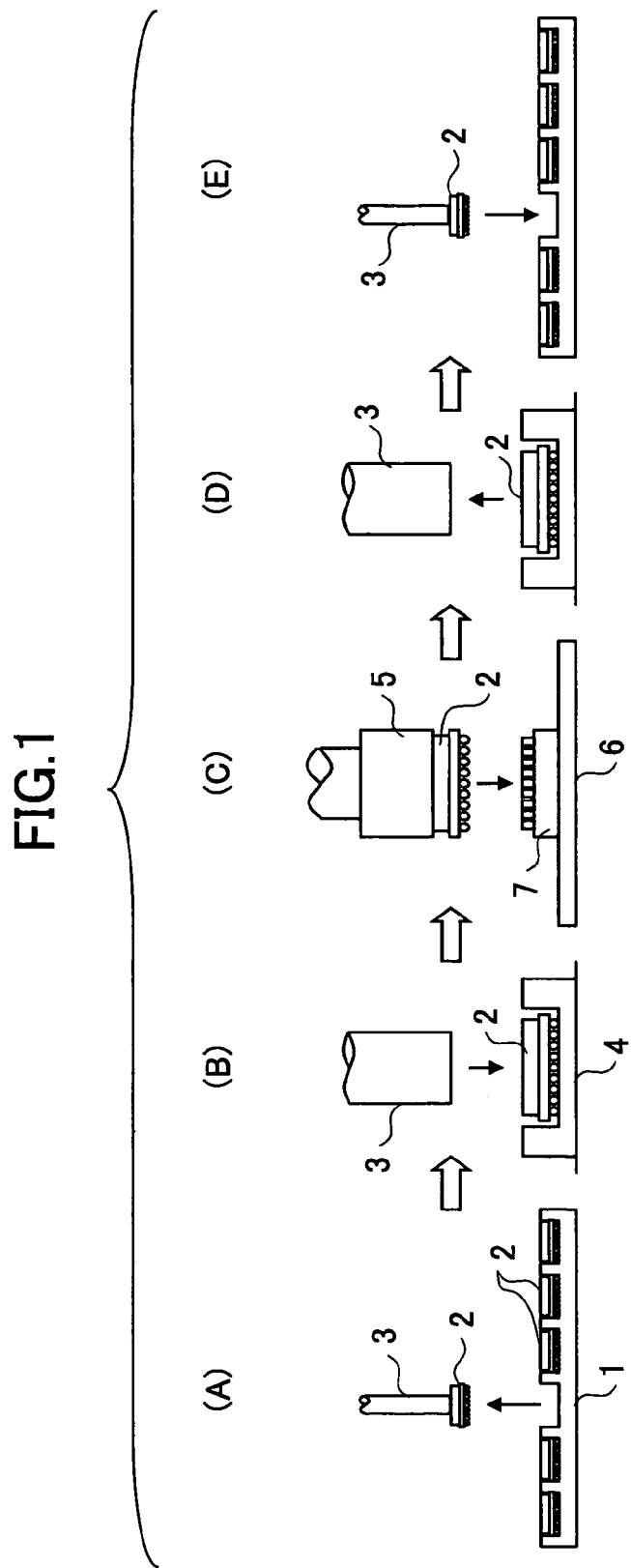
FIG. 1 is an illustration for explaining a first example of a process in a conventional characteristic test of a semiconductor device.
Figure 2:
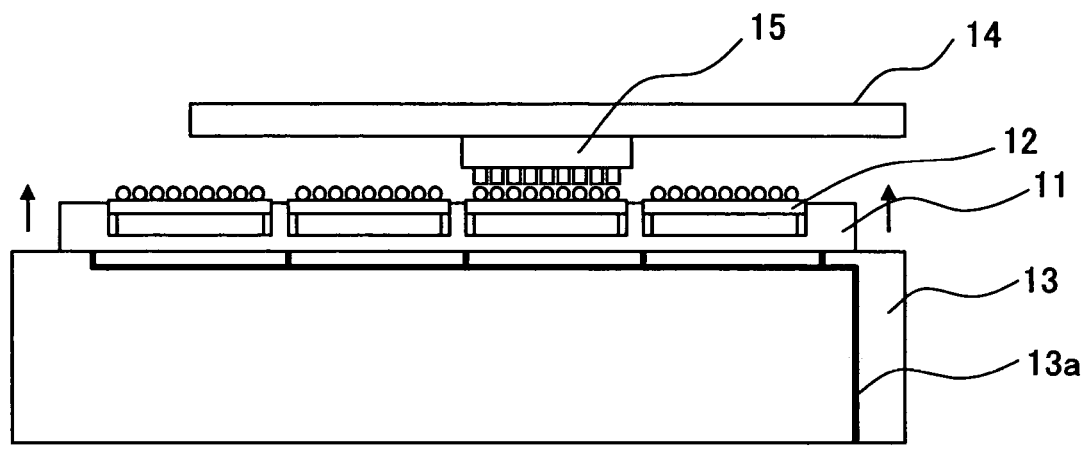
FIG. 2 is an illustration for explaining a second example of the process in the conventional characteristic test of a semiconductor device.
Figure 3:
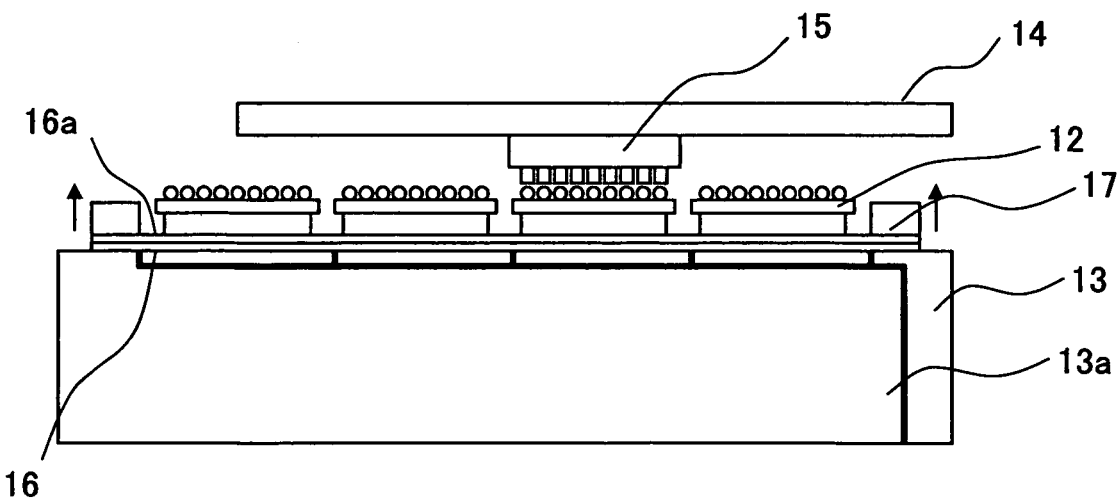
FIG. 3 is an illustration for explaining a third example of the process in the conventional characteristic test of a semiconductor device.
Figure 4:
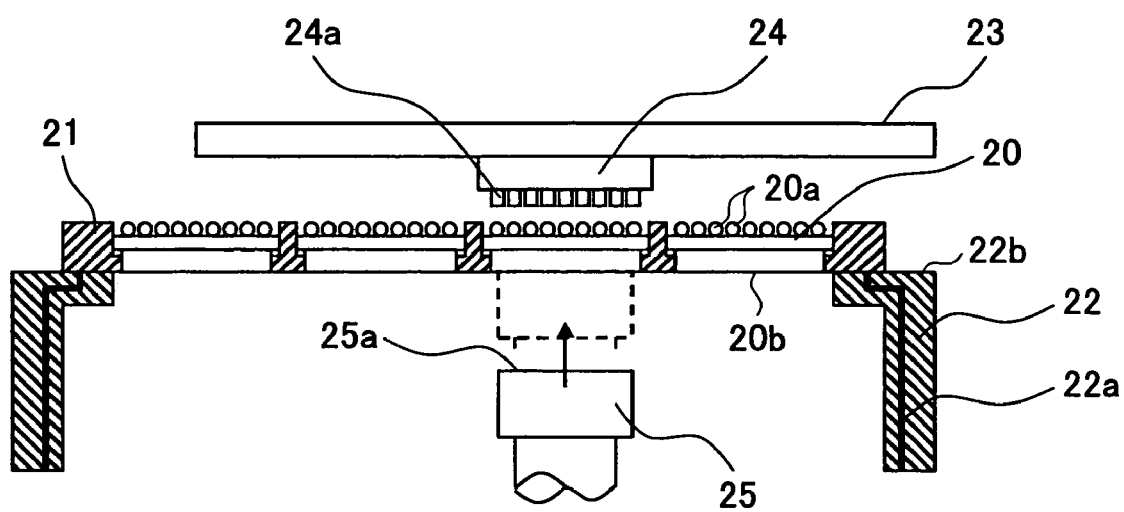
FIG. 4 is an illustration for explaining a testing method according to a first embodiment of the present invention.

As shown in FIG. 4, if the press head 25 is moved upward in this state, the press surface 25a of the press head 25 is brought into contact with the other main surface of the semiconductor device 20.

The top portion of the press head 25 has a size smaller than the semiconductor device 20 so that the top portion can be inserted into the recessed portion 21a of the support board 21. Accordingly, the semiconductor device 20 is pushed up by the press surface 25a of the press head 25, and the external connection terminals 20a of the semiconductor device 20 are brought into contact with the contact pieces 24a of the contactor 24 arranged above and are pressed by the contact pieces 24a.

Thus, an electric test is performed in the state in which the semiconductor device 20 is electrically connected to the testing device via the test circuit board 23. After the test is completed, the press head 25 is moved downward, and the semiconductor device 20 is accommodated in the recessed portion 21a of the support board 21.

Figure 5:
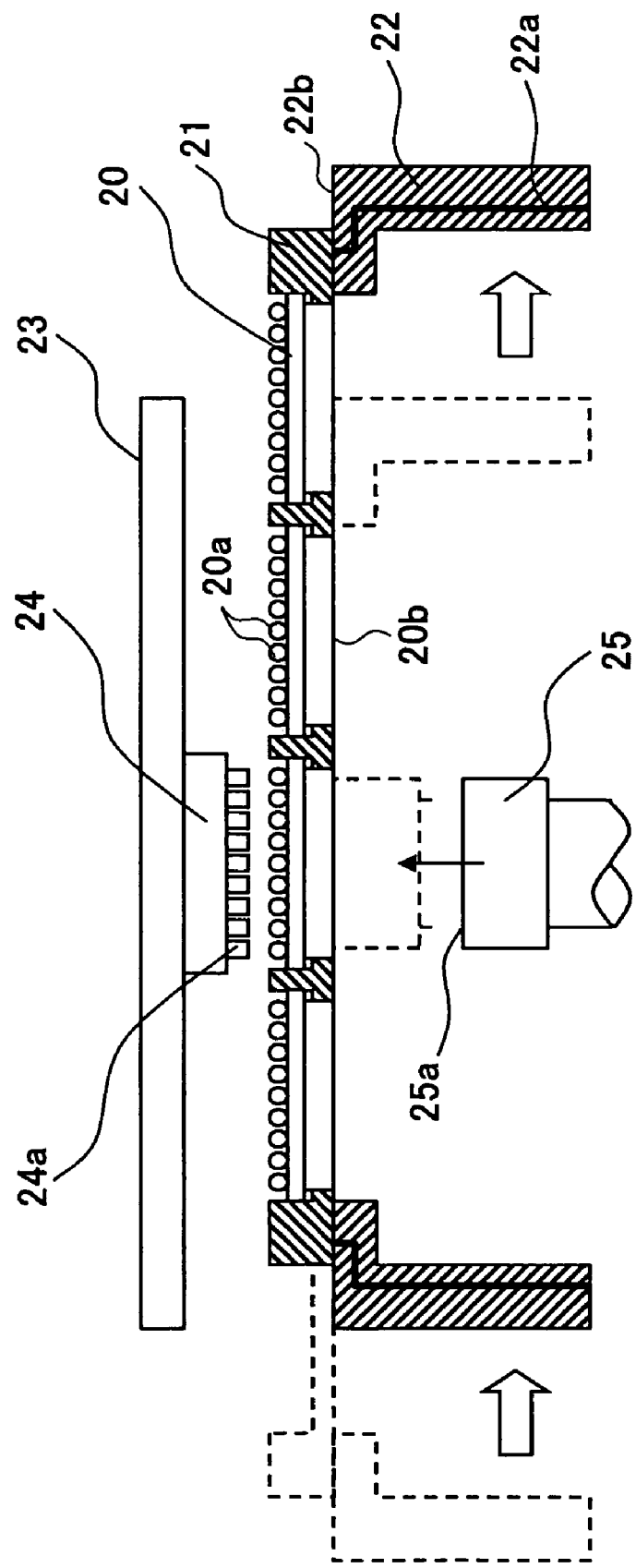
FIG. 5 is an illustration for explaining the testing method according to the first embodiment of the present invention.
Figure 6:
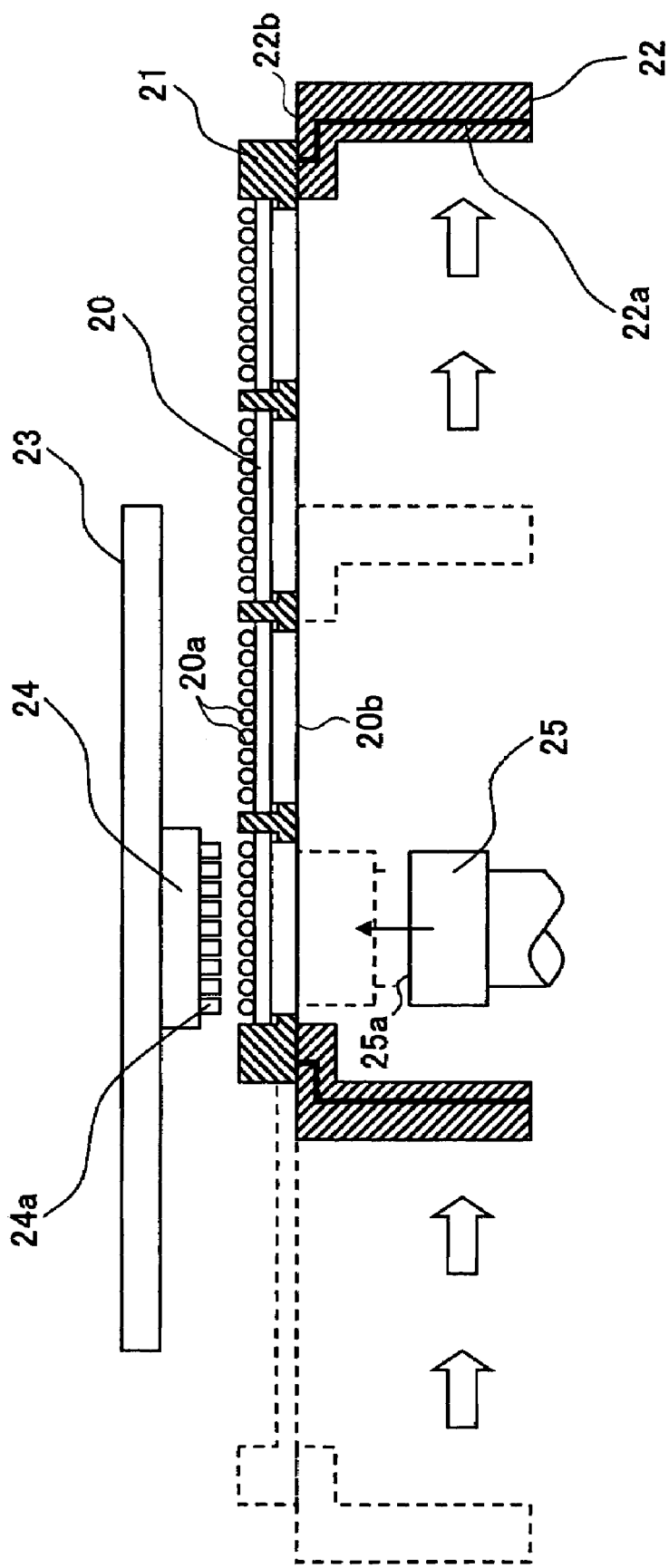
FIG. 6 is an illustration for explaining the testing method according to the first embodiment of the present invention.

Thereafter, as shown in FIG. 5, the stage 22 is moved in a horizontal direction so as to position a next semiconductor device 20 directly under the contactor 24 of the test circuit board 23.

Although a next one of the semiconductor device 20 positioned adjacent to one of the semiconductor device 20 that has already been tested is positioned directly under the contactor 24 in the example shown in FIG. 5, any one of the semiconductor devices 20 can be selected as the next one of the semiconductor devices to be tested.

The press head 50 is moved upward again in the state where the next one of the semiconductor devices 20 is positioned directly under the contactor 24, and a desired electric test is performed while causing the external contact terminals of the semiconductor device 20 to contact with the contact pieces of the contactor 24.

After the test, the press head 50 is moved downward so as to accommodate the semiconductor device 20 to be tested in the recessed portion 21a of the support board 21, the stage 22 is horizontally moved so as to move a next one of the semiconductor devices 20 to be tested to a position directly under the contactor 24. Then, the press head 25 is moved upward so as to perform an electric test while causing the external connection terminals of the semiconductor device 20 to contact with the contact pieces of the contactor 24.

Thus, in the testing device and method according to the first embodiment of the present invention, the support board 21 on which a plurality of semiconductor devices are mounted in an aligned state is moved horizontally (transversely) so as to sequentially moves the semiconductor devices to be tested to the position directly under the contactor 24, and, then, the press head 25 is moved upward to push up the semiconductor device 20 so as to perform an electric test while causing the external connection terminals of the semiconductor device 20 concerned being brought into contact with the contact pieces of the contactor 24.

At this time, the contactor 24 does not move and is maintained at the same position, and the press head 25 alone moves upward and downward. That is, there is no need to provide a part having a complex structure such as the contactor 24 and the like in a part that moves upward and downward, thereby simplifying the structure of the testing device. Additionally, an arbitrary one of the semiconductor devices can be selectively tested by merely moving the stage 22 in horizontal (transverse) directions.

Additionally, there is no need to move the test circuit board 24 and the contactor 24, thereby simplifying the structure of the testing device.

Further, the support board 21 itself can be used as an accommodation/conveyance tray by causing the support board 21, which holds the semiconductor devices 20, to be attachable to the stage 22, and there is no need to transfer the semiconductor devices 20 from a tray to a positioning stage, which allows to attempt simplification of the test process.

It should be noted that although the stage 22 is configured and arranged to be movable only in horizontal directions, the stage 22 including the press head 25 may be movable in upward and downward directions (vertical directions).

For example, when attaching or detaching the support board 21 to or from the stage 22, a large space is formed between the stage 22 and the contactor 24 by moving the stage 22 by a large distance so as to eliminate limitation in the movement of the support board.

Figure 9:
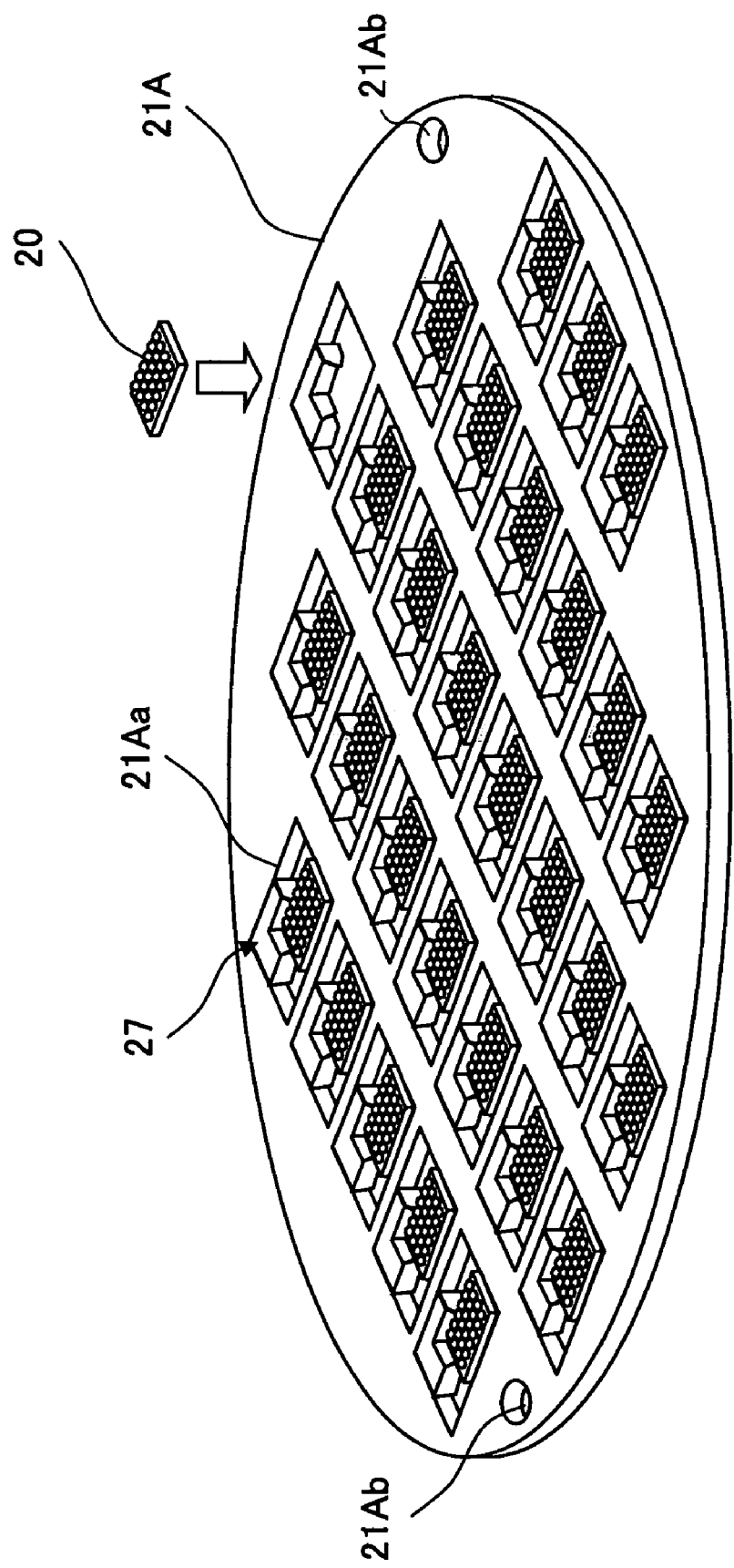
FIG. 9 is a perspective view of a support board having recessed portions each provided with one-side moving mechanism.

A description will now be given, with reference to FIGS. 9 through 13, of a one-side moving mechanism as an example of the positioning and the fixing mechanism. FIG. 9 shows a support board 21A having recessed portions 21Aa each of which is provided with a one-side moving mechanism 27.

As shown in FIGS. 10 through 13, the one-side moving mechanism 27 includes a one-side moving plate 27A and a spring 27B. The one-side moving plate 27A is urged by the spring 27B so as to contact with a corner portion of the semiconductor device 20, which is accommodated in the recessed portion 21Aa formed in a rectangular shape so that the semiconductor device 20 is pressed against one corner of the recessed portion 21Aa.

Figure 10:
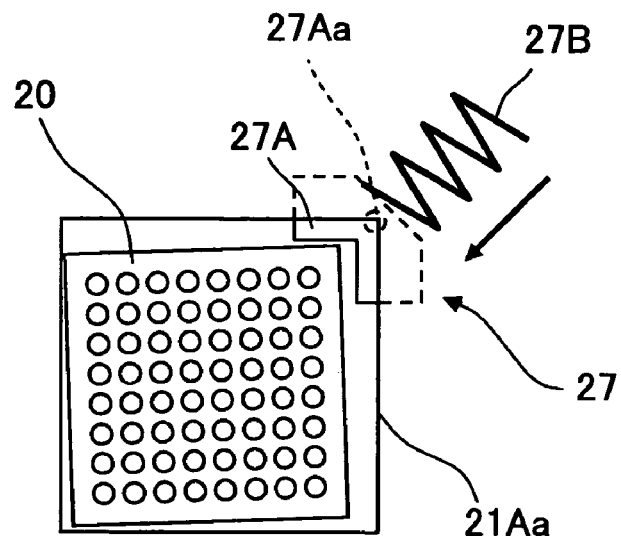
FIG. 10 is an enlarged view of the recessed portion provided with the one-side moving mechanism.

As shown in FIG. 10, the recessed portion Aa has a configuration and area that can accommodate each semiconductor device 20, and the one-side moving plate 27A is located at a corner so as to be movable in a diagonal direction. The spring 27B urges the one-side moving plate 27A in a diagonal direction. Each recessed portion 21Aa in the support board 21A is formed with two sides forming the corner at which the semiconductor device 20 is pressed by the one-side moving mechanism 27 that are formed at accurate positions.

Figure 11:
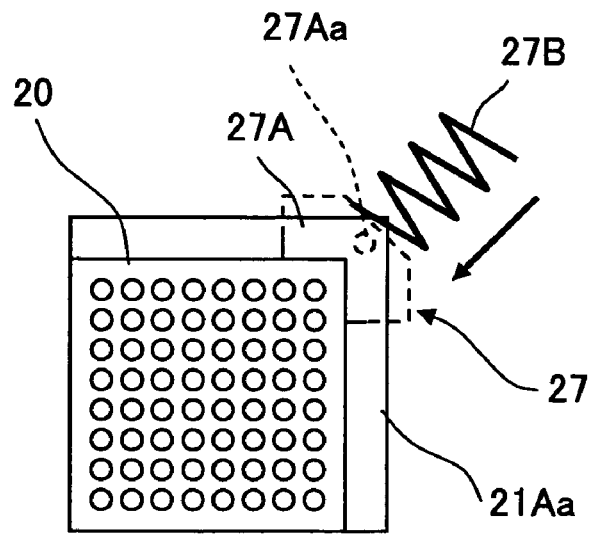
FIG. 11 is an enlarged view of the recessed portion provided with the one-side moving mechanism.

Therefore, as shown in FIG. 11, by pressing the semiconductor device 20 so as to contact with the two sides by the one-side moving plate 27A, each semiconductor device 20 is accurately positioned at a predetermined position of the support board 21A.

As mentioned above, the support board 21A is accurately positioned with respect to the stage 22 by the positioning pins 22c of the stage 22. Accordingly, the semiconductor devices 20 mounted on the support board 21A is arranged accurately with respect to the stage 22.

It should be noted that, in a state before the semiconductor device 20 is accommodated, the one-side plate 27A must be attracted to the corner against the spring 27B. Thus, the one-side moving plate 27A is provided with an open and close hole 27Aa so that the one-side moving plate 27A is moved against the spring 27B and retained by inserting a pin, for example, into the open and close hole 27Aa and moving the pin.

By using the one-side moving mechanism 27, semiconductor devices having different sizes can be accommodated and positioned in the recessed portions having the same size.

Figure 12:
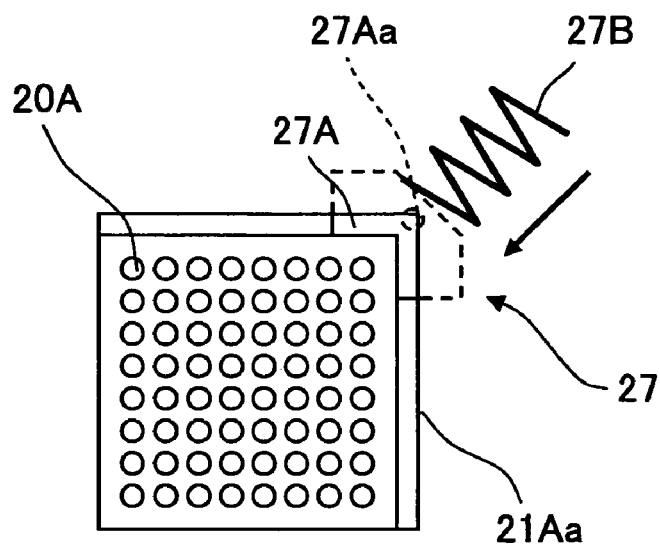
FIG. 12 is an enlarged view of the recessed portion provided with the one-side moving mechanism.
Figure 13:
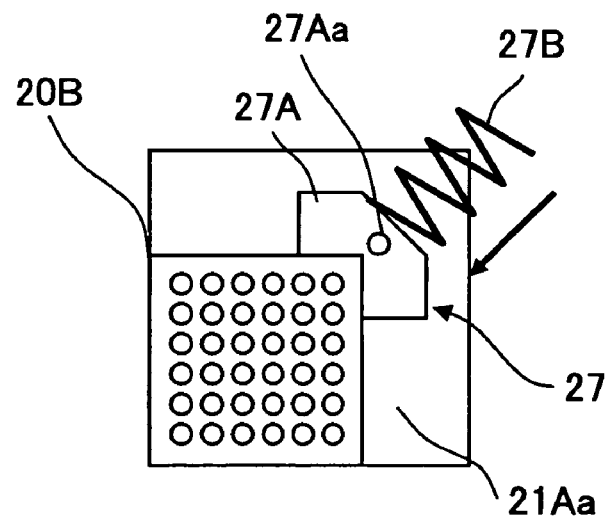
FIG. 13 is an enlarged view of the recessed portion provided with the one-side moving mechanism.

For example, as shown in FIG. 12, even a semiconductor device 20A having a size larger than the semiconductor device 20 shown in FIG. 11 can be accommodated in the recessed portion 21A by sufficiently attracting the one-side moving plate 27Aa. On the other hand, a semiconductor device 20B having a size smaller than the semiconductor device 20 shown in FIG. 11 can also be accommodated in the recessed portion 21Aa by moving the one-side moving plate 27A by a large distance by providing a large stroke to the spring 27B.

Although the semiconductor device can be positioned on the support board to be brought into contact with the contact pieces of the contactor 24 with high accuracy as mentioned above, the external connection terminals of the semiconductor device can be positioned accurately with respect to the contact pieces of the contactor 24 when the semiconductor device is held by the press head by providing a positioning mechanism to the press surface of the press head 25.

Figure 14:
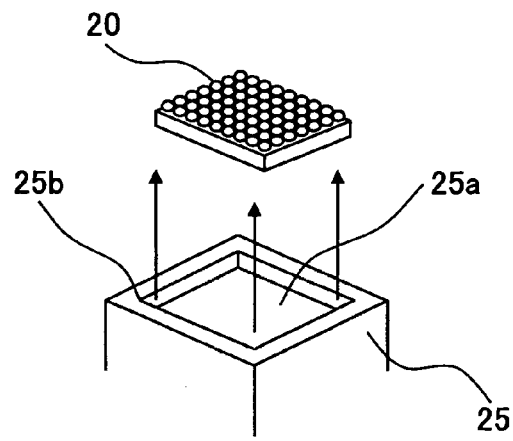
FIG. 14 is an illustration showing an outline of a positioning mechanism by a press head.

A description will now be given of a positioning mechanism provided to the press head 25. FIG. 14 shows an outline of the positioning mechanism provided to the press head 25.

In order to position the semiconductor device 20 by the press head 25, the press surface 25*a* of the press head 25 is processed so that the semiconductor device 20 is positioned on the press surface 25*a* when the semiconductor device 20 is supported by the press head 25. That is, as shown in FIG. 14, the semiconductor device 20 can be positioned by forming positioning guides 25*b* to protrude from a periphery of the press surface 25*a* of the press head 25 so as to cause the semiconductor device 20 to fall inside the positioning guides. The press head 25 and the contactor 24 are not movable in a horizontal direction, and, thus, the press head 25 and the contactor 24 can be positioned accurately to each other.

It should be noted that the positioning guide 25*b* are not necessarily formed on an entire periphery of the press surface 25*a*, and may be provided at a portion of each side of the press surface 25*a*.

Figure 15:
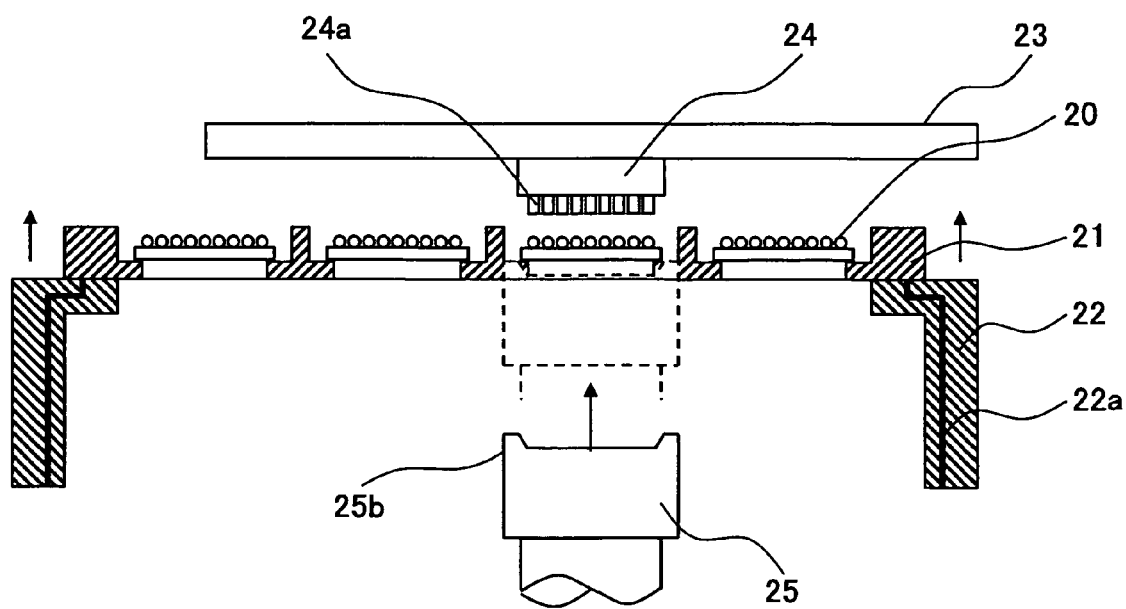
FIG. 15 is an illustration showing a testing device provided with a press head having slanting surfaces on positioning guides around a press surface.

FIG. 15 shows an example in which the semiconductor device 20 is easily fall onto the press surface 25*a* by providing slanting surfaces to the positioning guides 25*b* on the periphery of the press surface 25*a*.

In FIG. 15, the positioning guides 25*b* are provided at a center of each side of the press surface 25*a*, and the four corners of the semiconductor device 20 are supported in the recessed portion 21*a* of the support board 25. Accordingly, although not shown in the figure, four corners of the press head 25 are also cut off.

In the example shown in FIG. 15, when the press head 25 is moved upward and the semiconductor device 20 is supported by the press head 25, the semiconductor device 20 is guided to the press surface 25*s* by sliding the slanting surfaces of the positioning guides 25*b*, which gives positioning with high accuracy even if the positional accuracy of the semiconductor device 20 arranged on the support board 21 is not sufficiently large.

It should be noted that, in the example shown in FIG. 15, the stage 22 is also movable upward and downward so that the press head 25 is moved upward in a state where the stage 22 is moved upward and the semiconductor device is close to the contactor 24 before the semiconductor device 20 is pressed by the press head 25. Accordingly, the external connection terminals of the semiconductor device can be brought into contact with the contact pieces of the contactor by slightly lifting the semiconductor device.

Figure 16:
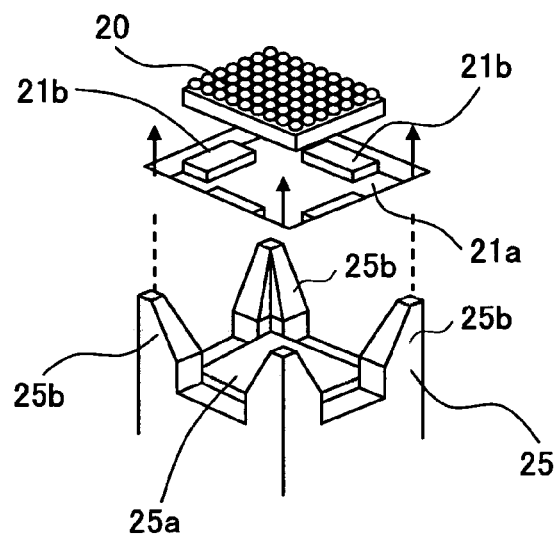
FIG. 16 is a perspective view of a press head provided with positioning guides on four corners of the press surface.

FIG. 16 shows an example of the press head 25 provided with positioning guides 25*b* at four corners of the press surface 25*a*. In FIG. 16, there are the recessed portion 21*a* of the support board 21 and the semiconductor device 20 arranged in the recessed portion 21*a* above the press head 25.

The semiconductor device 20 is supported by the support parts 21*b* which extends at positions corresponding to center portions of the sides of the semiconductor device 20. The positioning guides 25*b* having slanting surfaces are arranged outside the four corners of the press surface 25*a* of the press head 25.

Since the press surface 25*a* is smaller than an area surrounded by the support parts 21*b* of the support board 21, the press surface 25*a* protrudes from a bottom of the recessed portion 21*a* of the support board 21. Accordingly, the semiconductor device 20 supported by the press surface 25*a* as shown in FIG. 17 is lifted from the support board 21 by the press head 25 moving further upward, and the external connection electrodes of the semiconductor device 20 are pressed onto the contact pieces.

Figure 17:
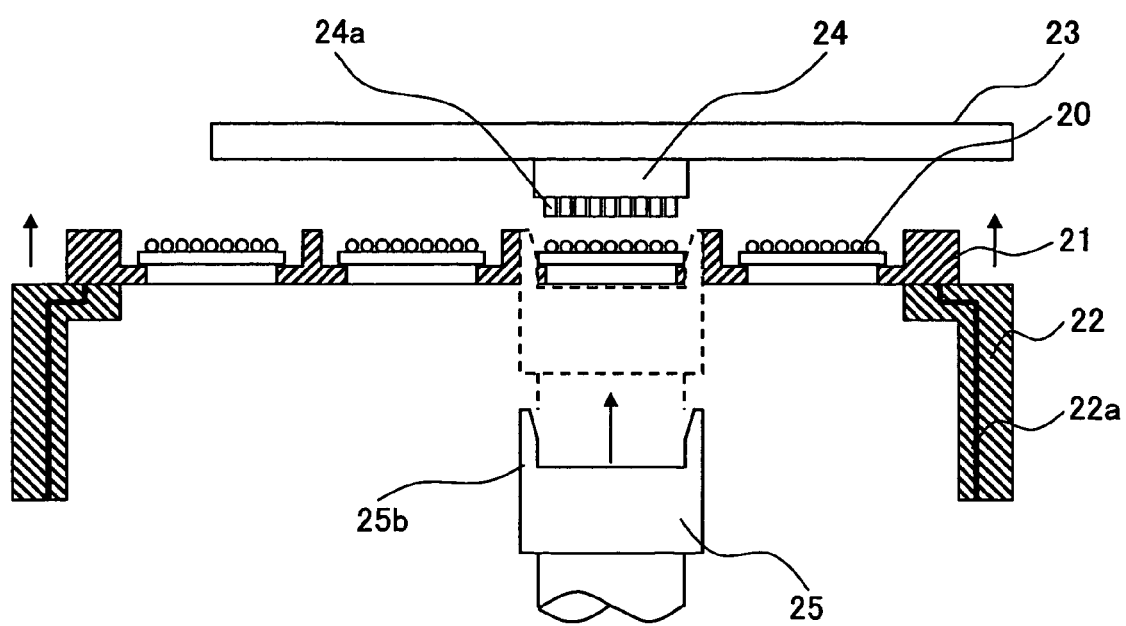
FIG. 17 is an illustration showing a testing device provided with the press head shown in FIG. 16.

It should be noted that, in the example shown in FIG. 17, the stage 22 is also movable upward and downward so that the press head 25 is moved upward in a state where the stage 22 is moved upward and the semiconductor device 20 is close to the contactor 24 before the semiconductor device 20 is lifted by the press surface 25*a* of the press head 25. Accordingly, the semiconductor device 20 can be brought into contact with the contactor by slightly lifting the semiconductor device 20.

Figure 18:
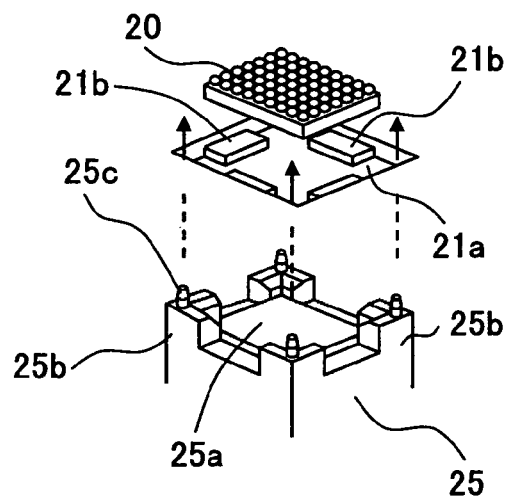
FIG. 18 is a perspective view of a press head provided with positioning pins on ends of positioning guides.
Figure 19:
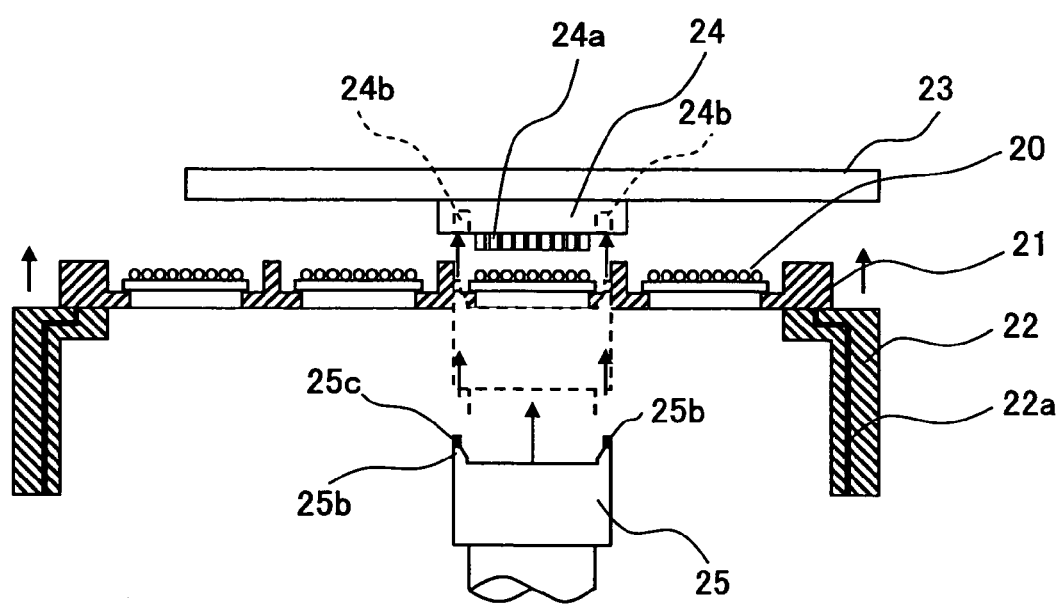
FIG. 19 is an illustration showing a testing device provided with a press head shown in FIG. 18.

FIG. 18 shows the press head provided with positioning pins 25*c* on the positioning guides 25*b* provided on the four corners of the press surface 25*a*. The positioning pins 25*c* protruding from the ends of the positioning guides 25*b* fit in positioning holes provided in the contactor 24 when the press head 25 is moved upward, as shown in FIG. 19. Thereby the contactor 24 and the press head 25 are positioned to each other with high accuracy, which results in the semiconductor device being positioned with high accuracy.

A description will now be given of a structure for improving an electric connection between the ball electrodes 20*a* of the semiconductor device 20 and the contact pieces 24*a* of the contactor 24 in the above-mentioned embodiment.

Figure 20:
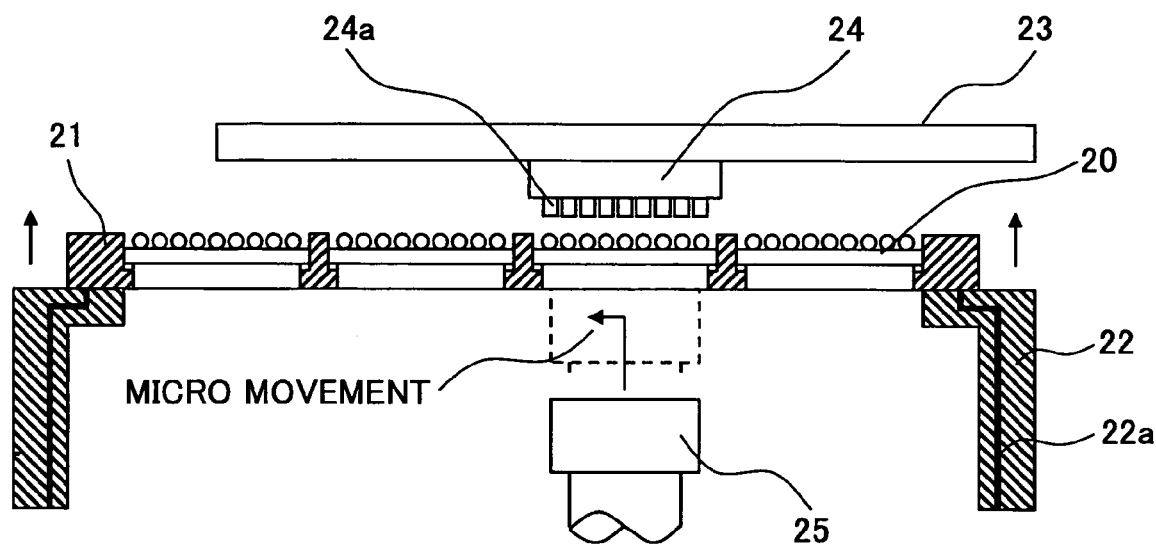
FIG. 20 is an illustration of a testing device configured to move a semiconductor device by a very small distance by a press head.
Figure 21:
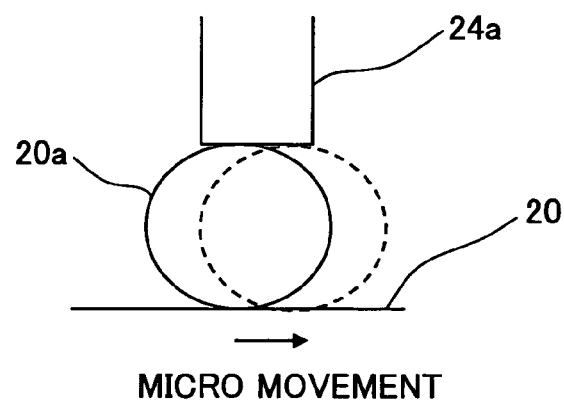
FIG. 21 is an enlarged view showing a state where a ball electrode of the semiconductor device and a contact piece of the contactor are contacted with each other.

FIG. 20 shows a structure for moving the semiconductor device 20 by a very small distance (minute movement) by the press head 25. That is, after the press head 25 is moved upward to cause the semiconductor device 20 to contact with the contactor 24, the press head 25 is minutely moved by a very small distance in a horizontal direction. Thereby, the external connection terminals (ball electrodes) 20*a* of the semiconductor device 20 moves horizontally in a state where the external connection terminals 20*a* are in contact with the contact pieces 24*a* of the contactor 24.

That is, since the external connection terminal 20*a* moves by a small distance while rubbing the surface of the contact piece 24*a*, an oxidation film or a foreign material adhering on the external connection terminal 20*a* or the surface of the contact piece 24*a* is removed, which improves an electric conductivity between the external connection terminal 20*a* and the contact piece 24*a*.

As an example of means for moving the press head 25 by a very small distance, it is applicable to mount a voltage actuator such as a piezoelectric element to the press head 25.

Figure 22:
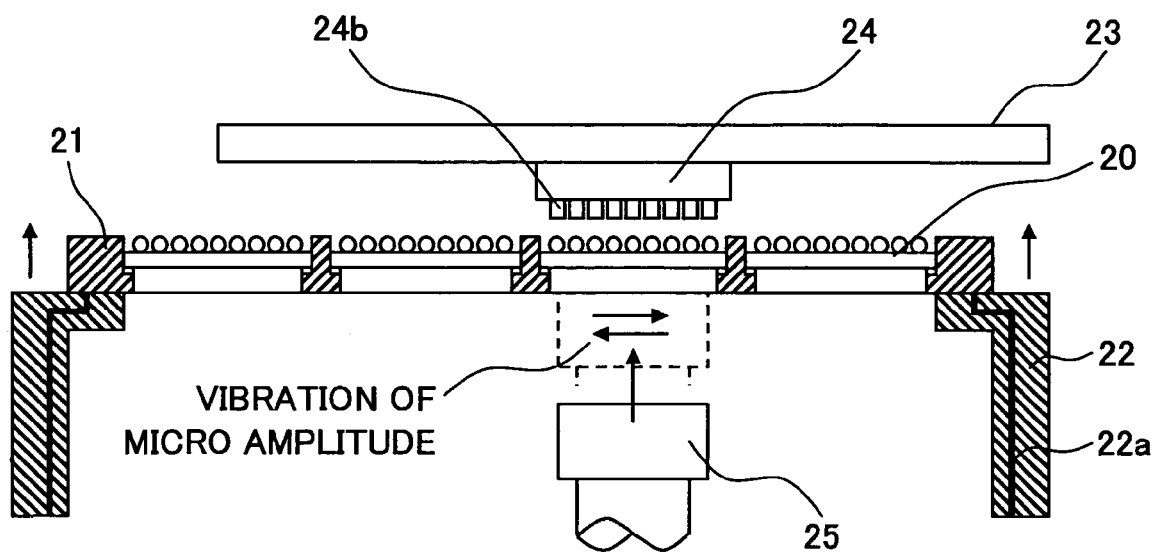
FIG. 22 is an illustration showing a testing device configured to move a semiconductor device with very small amplitude by a press head.
Figure 23:
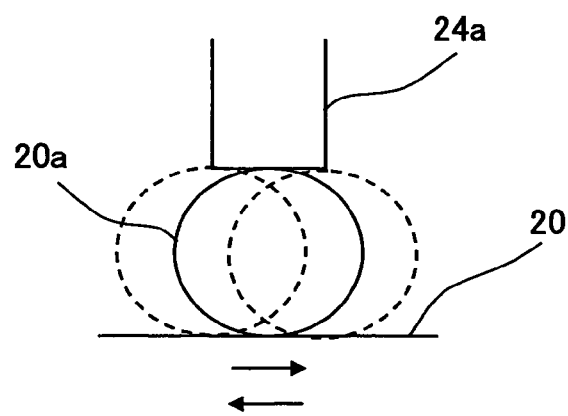
FIG. 23 is an enlarged view showing a state where a ball electrode of a semiconductor device and a contact piece of a contactor are contacted with each other.

FIG. 22 shows another structure for vibrating the semiconductor element 20 with very small amplitude by the press head 25. After moving the press head 25 upward, the press head 25 is vibrated with very small amplitude (minute movement) in a horizontal direction. Thereby, the external connection terminal 20*a* of the semiconductor element 20 minutely vibrates in a horizontal direction in a state where the external connection terminal is in contact with the contact piece 24*a* of the contactor 24.

That is, since the external connection terminal 20*a* vibrates with very small amplitude while rubbing the surface of the contact piece 24*a* of the contactor 24, an oxidation film or a foreign material adhering on the external connection terminal 20*a* or the surface of the contact piece 24*a* is removed, which improves an electric conductivity between the external connection terminal 20*a* and the contact piece 24*a*.

As an example of means for vibrating the press head 25 with very small amplitude, it is applicable to mount an ultrasonic oscillator such as a piezoelectric element to the press head 25.

Here, if a parallelism between the press surface 25*a* of the press head 25 and a surface formed by the end surface of the contact piece 24a of the contactor 24 is not maintained well, a large press force is applied to a portion of the external connection terminal (ball electrode) 20a of the semiconductor device 20 and it is possible that a sufficient press force is not applied to other portions. In such a case, an electric connection of the semiconductor device 20 is deteriorated, and it is impossible to perform a predetermined test.

Figure 24:
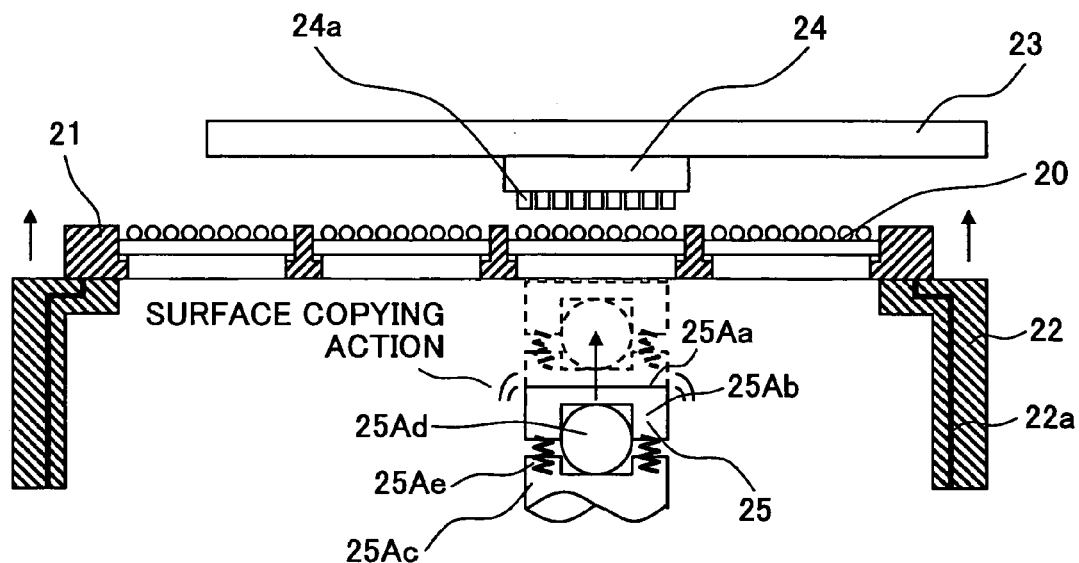
FIG. 24 is an illustration showing a testing device configured to cause an end portion of a press head having a press surface swingable.

In order to solve the above-mentioned problem, it is effective to take a structure shown in FIG. 24.

As shown in FIG. 24, the end portion 25Ab of the press head 25A is separated from a main body 25Ac, and a ball 25Ad is provided between the end portion 25Ab and the main body 25Ac. The end portion 25Ab and the main body 25Ac are connected to each other at periphery thereof by a spring 25Ae.

According to the structure of the press head 25A, the end portion 25Ab having the press surface 25Aa is supported by the ball 25Ad at a single point. Thus, the end portion 25Ab can incline in all directions. Accordingly, if a flat surface formed by the end portion of the contact piece 24a of the contactor 24 and the press surface 25Aa are not parallel to each other, the press surface 25Aa can move in accordance with the inclination of the contact piece 24a in the action of pressing the press head 25, which results in the press surface 25Aa and the surface formed by the end surface of the contact piece 24a being parallel to each other (so-called surface copying action). Thereby, all of the external connection terminals 20a of the semiconductor device 20 can be uniformly pressed onto the corresponding contact pieces 24a, which improves an electric conductivity.

Figure 25:
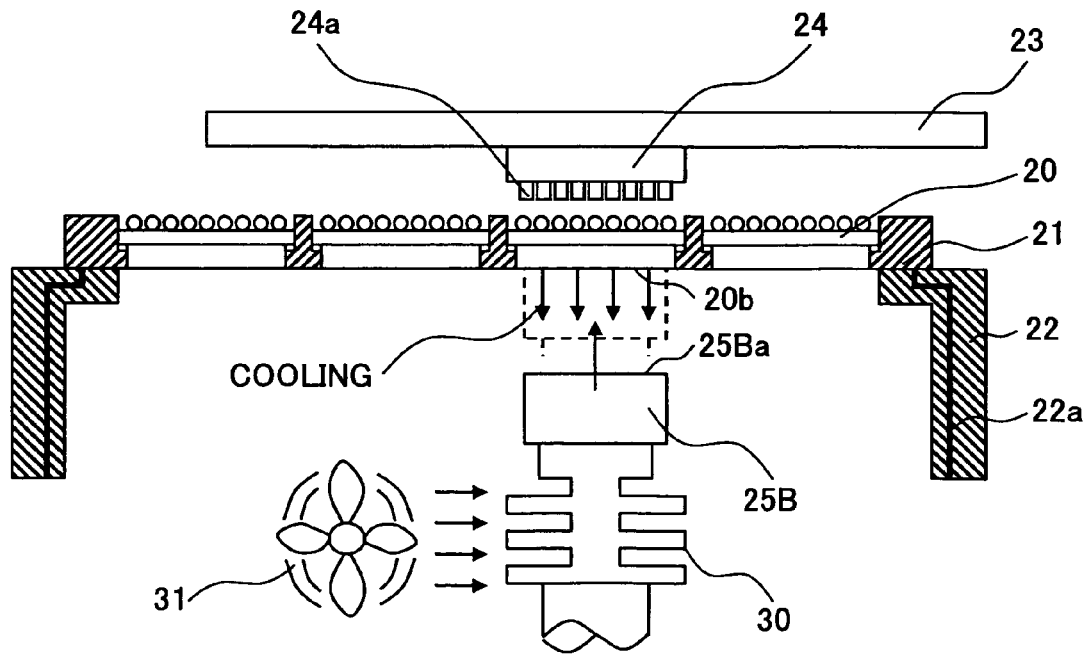
FIG. 25 is an illustration showing a testing device according to a second embodiment of the present invention that performs a characteristic test while cooling a semiconductor device by a press head.
Figure 26:
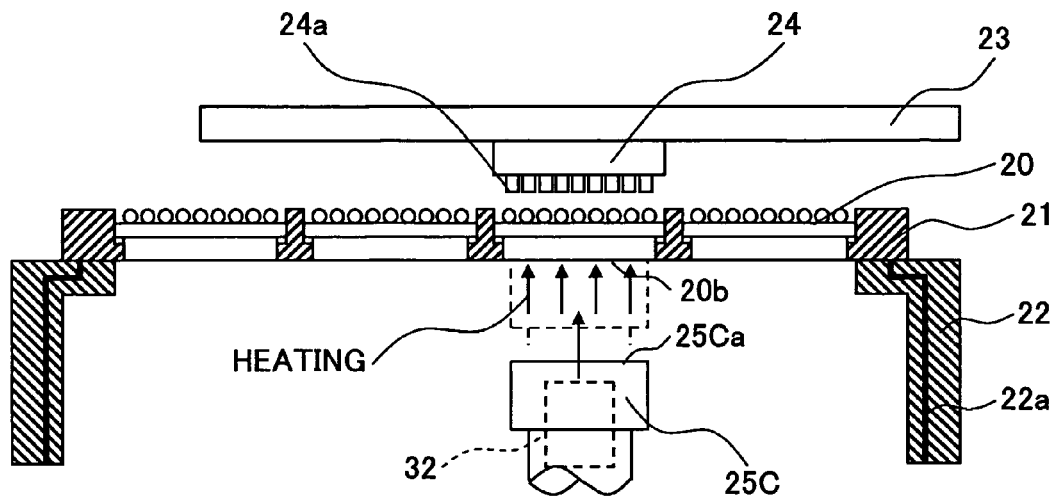
FIG. 26 is an illustration showing a testing device according to the second embodiment of the present invention that performs a characteristic test while heating a semiconductor device by a press head.
Figure 27:
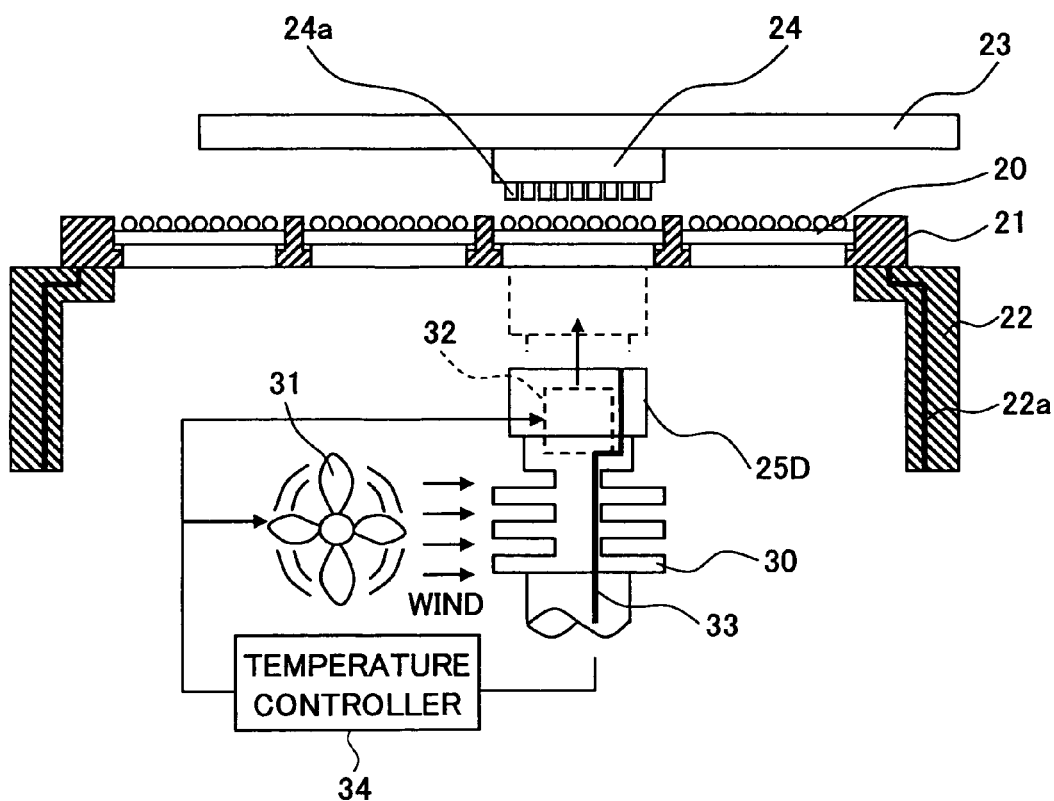
FIG. 27 is an illustration showing a testing device according to the second embodiment of the present invention that performs a characteristic test while heating and cooling a semiconductor device by a press head.

A description will now be given, with reference to FIGS. 25 through 27, of a second embodiment of the present invention. FIGS. 25 through 27 show a structure of a press head for performing a testing method according to the second embodiment of the present invention. FIG. 25 shows a testing device which performs a characteristic test while cooling the semiconductor device 20 by a press head 25B.

The press head 25B is provided with cooling fins 30, and a blower 31 is provided in the vicinity of the press head 31. The press head 25B is cooled by air flow directed to the fins 30 by the blower 31. That is, when heat is generated by the semiconductor 20, which is subjected to a characteristic test while being pressed onto the contactor 24 by the press head 25B, during the test, the generated heat is transferred to the press head 2B from the back surface 20b of the semiconductor device 20 and is released to the atmosphere from the fins 30, thereby cooling the semiconductor device 20.

Since the press surface 25Ba of the press head 25B is brought into contact with almost the entire back surface 20b of the semiconductor device 20, an area for transferring heat is large and, thus, the semiconductor device 20 can be cooled efficiently. Additionally, since the press head 25B is brought into contact with only one semiconductor device 20, the semiconductor device 20 is cooled efficiently.

FIG. 26 shows a testing device for performing a characteristic test while heating the semiconductor device 20 by a press head 25C. The press head 25C is provided with a heater 32 for heating so as to heat the press head 25C by generating heat by the heater 32.

That is, when the press head 25C is heated, the heat is transferred to the semiconductor device 20, which is subjected to a characteristic test while being pressed onto the contactor 24, and, thus, the semiconductor device 20 is heated.

As mentioned above, since the press surface 25Ca of the press head 25C is brought into contact with almost the entire surface of the back surface 20b of the semiconductor device 20, an area for transferring heat is large, thereby heating the semiconductor device 20 efficiently. Additionally, since the press head 25C is brought into contact with only one semiconductor device 20, the semiconductor device 20 is heated efficiently.

FIG. 27 shows a testing device for performing a characteristic test while heating and/or cooling the semiconductor device 20 by a press head 25D. The press head 25D is provided with the fins 30 for cooling and the heater 32 for heating, and the blower 31 is provided in the vicinity of the press head 25D. The press head 25D is heated by heating the heater 32, and the press head 25D is cooled by air flow being directed to the fins 30 by the blower 31.

A temperature sensor 33 is embedded into the press head 25D. The temperature sensor 33 detects a temperature near the press surface 25D and sends a signal corresponding to the detected temperature to a temperature controller 34. The temperature near the press surface 25D approximates the temperature of the semiconductor device 20. Thus, the temperature detected by the temperature sensor can be regarded as the temperature of the semiconductor device 20.

The temperature controller 34 adjusts a power supply to the heater 32 or a power supply to the blower 31 in accordance with the temperature detected by the temperature sensor 33 so as to control the temperature detected by the temperature sensor 33 (that is, the temperature of the semiconductor device 20) becomes a desired target temperature.

Since the press surface 25Da of the press head 25D is brought into contact with almost the entire surface of the back surface 20b of the semiconductor device 20, an area for transferring heat is large, thereby heating or cooling the semiconductor device 20 efficiently. Additionally, since the press head 25D is brought into contact with only one semiconductor device 20, the semiconductor device 20 is heated or cooled efficiently.

Figure 28:
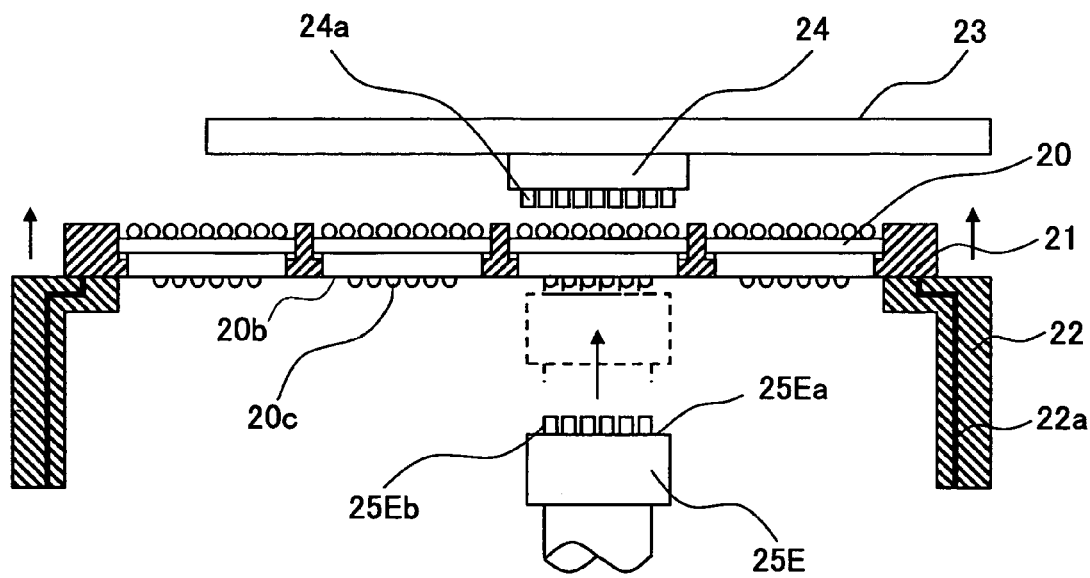
FIG. 28 is an illustration showing a testing device according to a third embodiment of the present invention that performs a characteristic test on a semiconductor device provided with mounting terminals on a back surface thereof.

A description will now be given, with reference to FIG. 28 and FIG. 29, of a testing device and a testing method of a semiconductor device according to a third embodiment of the present invention. FIG. 28 shows a testing device and testing method for performing a characteristic test of the semiconductor device 20, which is provided with external connection terminals on the back surface 20b thereof.

As shown in FIG. 28, a contact piece 25Eb is provided to the press surface 25Ea of the press head 25E. The contact piece 25Eb is brought into contact with the external connection terminal 20c formed on the back surface 20b of the semiconductor device 20. The contact piece 25Eb has a configuration to receive the external connection terminal 20c. That is, the contact piece 25Eb of the press head 24E contacts and presses the external connection terminal 20c of the semiconductor device 20, thereby, pressing the external connection terminal 20c of the semiconductor device 20 onto the contactor 24.

As mentioned above, according to the present embodiment, even if the semiconductor device 20 has external connection terminals on both sides thereof, a contact can be made simultaneously to both the external connection terminals on both sides, thereby permitting a test being performed on the semiconductor device 20.

Figure 29:
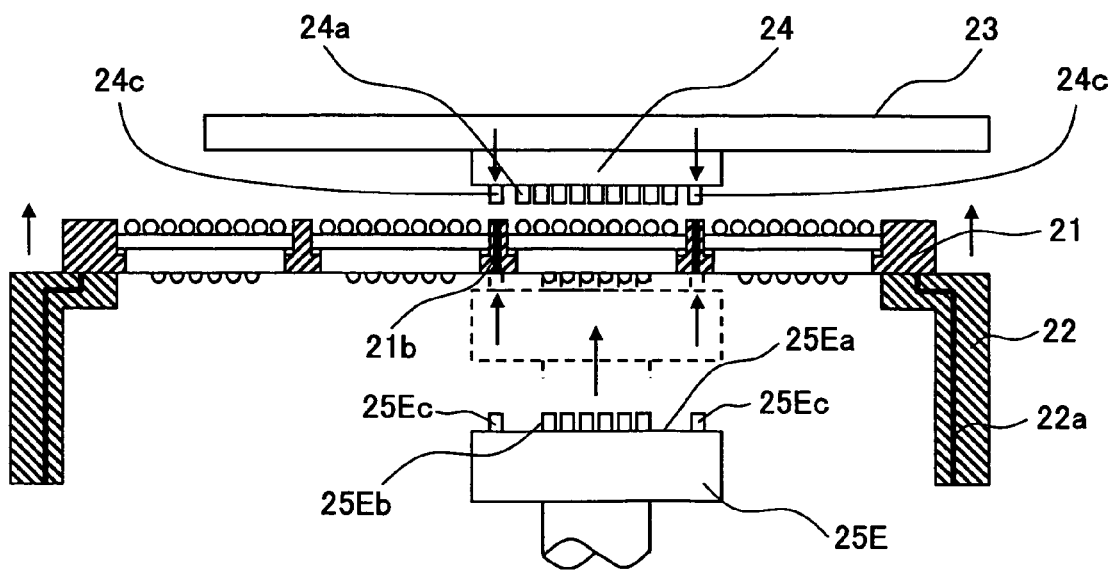
FIG. 29 is an illustration of a testing device configured to electrically connect a contact piece of a press head to a contactor of a test circuit board.

FIG. 29 shows a variation of the embodiment shown in FIG. 28. In this variation, the contact piece 25Eb of the press head 25E is electrically connected to the contactor 24 of the test circuit board 23. A contact piece 25Ec is provided around the contact piece 25Eb provided on the press head 25E, and the contact piece 25Eb and the contact piece 25Ec are electrically connected on the side of the press head 25E.

In order to do so, a through electrode 21b, which extends through the support board 21, is provided at a position corresponding to the contact piece 25Ec. Accordingly, in the present embodiment, the support board 21 is formed of an insulating material such as a synthetic resin or the like. Additionally, the contact piece 24c is provided around the contact piece 24a. Further, the stage 22 is configured to be movable in upward and downward directions (vertical directions).

In the above-mentioned structure, when the stage 22 and the press head 25E are moved upward so as to press the semiconductor device 20 to the contactor 24, the external connection terminals 20c of the back surface 20b of the semiconductor device 20 contact with the contact pieces 25Eb of the press head 20E, and the contact piece 25Ec of the press head 25E contacts with the through electrode 21b of the support board 21. Further the through electrode 21b of the support board 21 contacts the contact piece 24c of the contactor 24. Accordingly, the external connection terminals 20c of the back surface 20b of the semiconductor device 20 are electrically connected to the test circuit board 23 through the contact piece 25Eb, the contact piece 25Ec, the through electrode 21b and the contact piece 24c.

According to the above-mentioned structure, there is no need to connect an electric circuit on the side of the press head 25E which is a movable part, and signals and power supplied to the semiconductor device 20 and signals output from the semiconductor device 20 are all supplied from or output to the test circuit board 23.

A description will now be given, with reference to FIG. 30 and FIG. 31, of a test device and a test method of a semiconductor device according to a fourth embodiment of the present invention.

Figure 30:
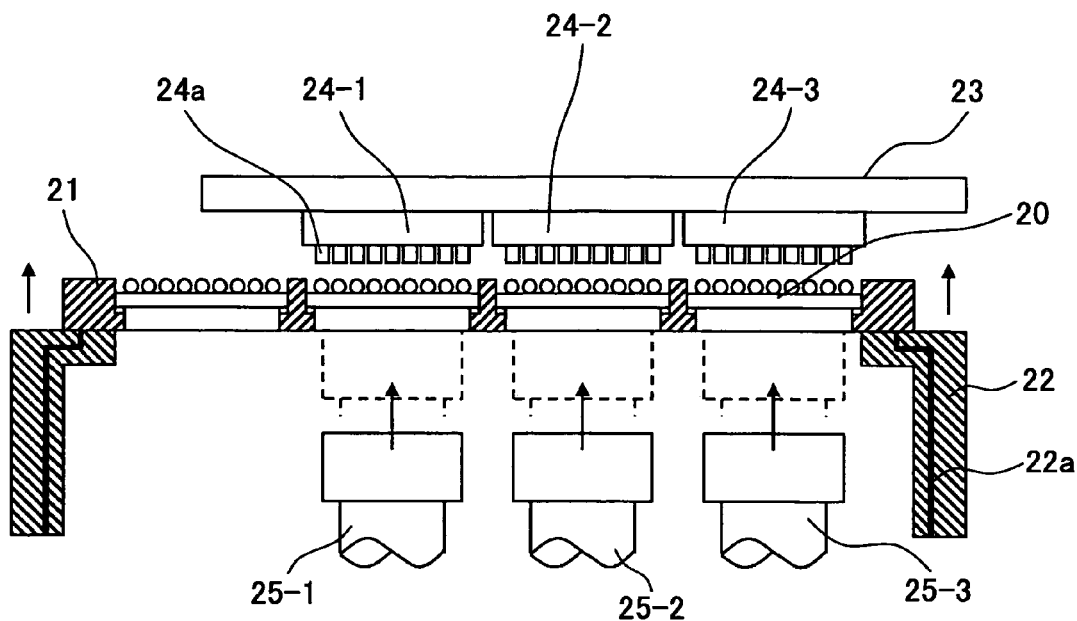
FIG. 30 is an illustration showing a rest device according to a fourth embodiment of the present invention that has a plurality of contactors and a plurality of press heads.

In the testing device of a semiconductor device according to the fourth embodiment of the present invention shown in FIG. 30, a plurality of contactor 24-1, 24-2 and 24-3 are provided to the test circuit board 23, and a plurality of press heads 25-1, 25-2 and 25-3 area provided correspondingly. According to the contactors 24-1, 24-2 and 24-3 and the corresponding press heads 25-1, 25-2 and 25-3, a contact can be made simultaneously to a plurality of semiconductor devices.

Figure 31:
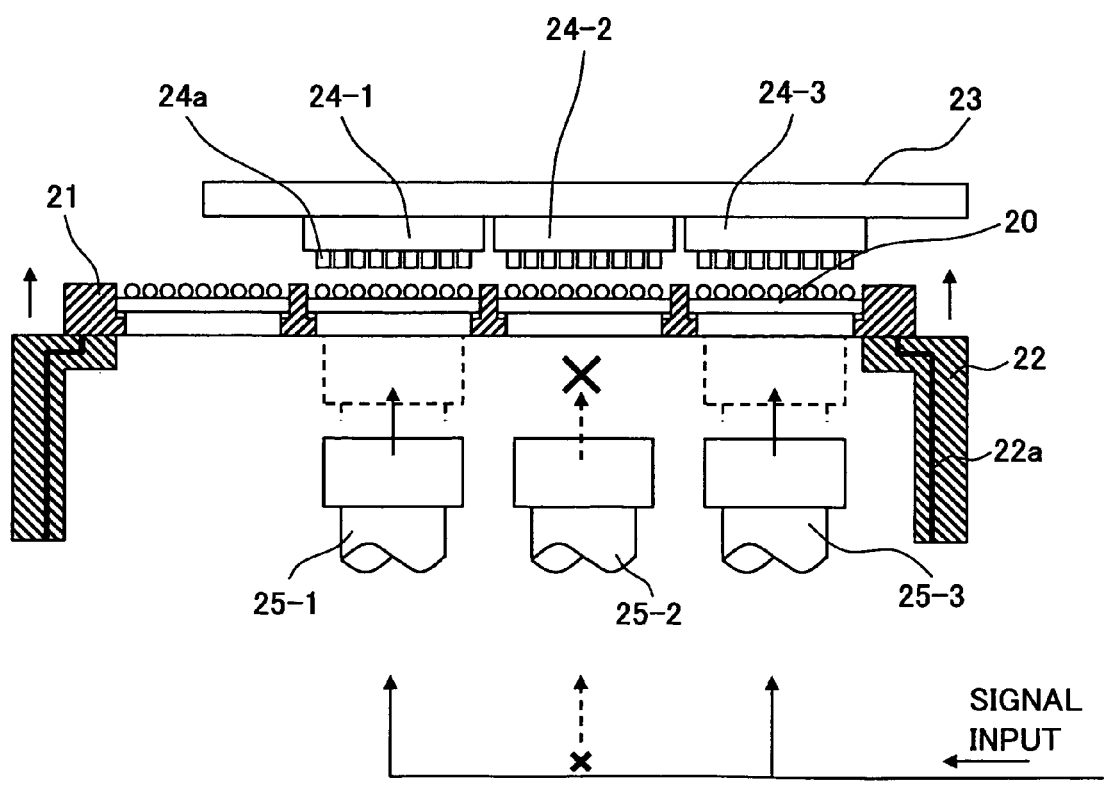
FIG. 31 is an illustration showing an operation of the testing device shown in FIG. 30.

In the testing device having the above-mentioned structure, as shown in FIG. 31, an upward movement of each of the press heads is controlled individually so as to selectively move the plurality of press heads upward and selectively test the semiconductor devices.

In the example shown n FIG. 31, the press heads 25-1 and 25-3 are moved upward but the press head 25-2 is no moved upward. According to such a structure, in a case, for example, where the semiconductor device 20 corresponding to the press head 25-2 is determined as a defective one, a test is not performed on the semiconductor device 20 concerned by not moving the corresponding press head upward so as to attempt an efficient test.

According to the structure shown in FIG. 31, a plurality of semiconductor devices 20 can be tested at once. Additionally, by appropriately combining the above-mentioned structures of the embodiments, various effects can be obtained.

For example, by adding the structure of controlling a temperature of a semiconductor device as in the above-mentioned second embodiment, a temperature control appropriate for each semiconductor device can be individually performed when testing a plurality of semiconductor devices.

FIG. 32 shows an example in which a plurality of semiconductor devices are subjected to a temperature control individually while being simultaneously tested. In the example shown in FIG. 32, the press head 25-1 and the press head 25-2 are provided so as to perform a test on the two semiconductor devices 20 simultaneously. The press head 25-1 is provided with a heater 32-1, a cooling unit 35-1 using a cooling water and a temperature sensor 33-1. Similarly, the press head 25-2 is provided with a heater 32-2, a cooling unit 35-2 using a cooling water and a temperature sensor 33-2. The heater 32-1 and the cooling unit 35-1 are controlled by a temperature controller 34-1. The heater 32-1 and the cooling unit 35-2 are controlled by a temperature controller 34-2.

Accordingly, a temperature of the semiconductor device 20 pressed by the press head 25-1 is controlled by the temperature controller 34-1, and a temperature of the semiconductor device 20 pressed by the press head 25-2 is controlled by the temperature controller 34-2. That is, the semiconductor devices 20 are subjected to a test in a state where each of the semiconductor devices is temperature-controlled individually.

The present invention is not limited to the specifically disclosed embodiments, and variations and modifications may be made without departing from the scope of the present invention.

The present application is based on Japanese priority application No. 2005-105226 filed Mar. 31, 2005, the entire contents of which are hereby incorporated herein by reference.

What is claimed is:

1. A testing device of a semiconductor device, comprising:
    a test circuit board having a contactor provided with contact pieces corresponding to external connection terminals of semiconductor devices to be tested;
    a support board that is capable of mounting the semiconductor devices thereon in an aligned state;
    a stage supporting said support board; and
    a press head that presses the semiconductor devices to be tested mounted on said support board so as to cause external connection terminals of the semiconductor devices to be tested to contact with the contact pieces of said contactor, said press head being movable with respect to said support board,
    wherein said stage is movable to a position at which at least one of the semiconductor devices to be tested, which are mounted on said support board, faces said contactor.

2. The testing device of a semiconductor device as claimed in claim 1, further comprising a positioning mechanism that positions said support board with respect to said stage.

3. The testing device of a semiconductor device as claimed in claim 1, wherein said support board is provided with recessed portions that accommodate the semiconductor devices to be tested.

4. A testing device of a semiconductor device, comprising:
    a test circuit board having a contactor provided with contact pieces corresponding to external connection terminals of semiconductor devices to be tested;
    a support board that is capable of mounting the semiconductor devices thereon in an aligned state;
    a stage supporting said support board; and
    a press head that presses the semiconductor devices to be tested mounted on said support board so as to cause external connection terminals of the semiconductor devices to be tested to contact with the contact pieces of said contactor, wherein said stage is movable to a position at which at least one of the semiconductor devices to be tested, which are mounted on said support board, faces said contactor, and wherein positioning guides are formed to protrude around a press surface of said press head for guiding each of the semiconductor devices onto the press surface.

5. The testing device of a semiconductor device as claimed in claim 4, wherein positioning pins are provided so as to protrude from said positioning guides, and positioning holes are provided to said contactor at positions corresponding to the positioning pins.

6. The testing device of a semiconductor device as claimed in claim 1, wherein said press head moves or vibrates minutely in a horizontal direction.

7. The testing device of a semiconductor device as claimed in claim 1, wherein a press surface of said press head is capable of slanting in an arbitrary direction with respect to a horizontal direction.

8. The testing device of a semiconductor device as claimed in claim 1, further comprising a temperature control mechanism that controls a temperature of a press surface of said press head.

9. The testing device of a semiconductor device as claimed in claim 8, wherein said temperature control mechanism includes cooling fins provided to said press head and a blower that direst air flow toward the cooling fins.

10. The testing device of a semiconductor device as claimed in claim 8, wherein said temperature control mechanism includes a heater provided to said press head.

11. The testing device of a semiconductor device as claimed in claim 8, wherein said temperature control mechanism includes a cooling unit provided to said press head and having a flow passage through which a coolant flows.

12. The testing device of a semiconductor device as claimed in claim 8, wherein said temperature control mechanism includes a temperature sensor that detects a temperature in the vicinity of the press surface of said press head and a temperature controller that performs a temperature control based on the temperature detected by the temperature sensor.

13. The testing device of a semiconductor device as claimed in claim 1, wherein the semiconductor devices have mounting terminals on back surfaces thereof, and first contact pieces configured to contact with the mounting terminals are provided to a press surface of said press head.

14. The testing device of a semiconductor device as claimed in claim 13, wherein second contact pieces are provided on said press surface of said press head around the first contact pieces, and through electrodes configured to contact with the second contact pieces are provided to extend through said support board, and third contact pieces configured to contact with the through electrodes are provided to said contactor.

15. The testing device of a semiconductor device as claimed in claim 1, wherein a plurality of said contactors are attached to said test circuit board, and a plurality of said press heads are provided to correspond to the plurality of contactors are provided.

* * * * *